United States Patent [19]
Hirano et al.

[11] Patent Number: 6,028,782
[45] Date of Patent: Feb. 22, 2000

[54] DATA READING METHOD OF FERROELECTRIC MEMORY DEVICE, AND FERROELECTRIC MEMORY DEVICE

[75] Inventors: Hiroshige Hirano, Nara; Koji Asari, Takatsuki, both of Japan

[73] Assignee: Matsushita Electronics Corporation, Osaka, Japan

[21] Appl. No.: 08/952,395

[22] PCT Filed: Mar. 18, 1997

[86] PCT No.: PCT/JP97/00882

§ 371 Date: Nov. 18, 1997

§ 102(e) Date: Nov. 18, 1997

[87] PCT Pub. No.: WO97/35314

PCT Pub. Date: Sep. 25, 1997

[30] Foreign Application Priority Data

Mar. 18, 1996 [JP] Japan ................................. 8-060528
Jul. 5, 1996 [JP] Japan ................................. 8-176079

[51] Int. Cl.$^7$ .................................................. G11C 11/22
[52] U.S. Cl. ........................................... 365/145; 365/149
[58] Field of Search ..................................... 365/145, 149

[56] References Cited

U.S. PATENT DOCUMENTS 4,873,664 10/1989 Eaton, Jr. ................................. 365/145

FOREIGN PATENT DOCUMENTS

| 0 486 901 | 5/1992 | European Pat. Off. . |
| 0 631 287 | 12/1994 | European Pat. Off. . |
| 1-158691 | 6/1989 | Japan . |
| 6-125056 | 5/1994 | Japan . |
| 8-263989 | 10/1996 | Japan . |
| 8-273375 | 10/1996 | Japan . |
| 8-293195 | 11/1996 | Japan . |
| 93/12542 | 6/1993 | WIPO . |

OTHER PUBLICATIONS

Japanese language search report for Int'l Application No. PCT/JP97/00882.
English translation of Japanese language search report.

*Primary Examiner*—Huan Hoang
*Assistant Examiner*—M. Tran
*Attorney, Agent, or Firm*—Ratner & Prestia

[57] ABSTRACT

It is an object to present a reading method of a ferroelectric memory device capable of operating at low voltage more securely than in the prior art, and a ferroelectric memory device. To achieve the object, for example, as shown in FIG. 1, after applying a pulse from cell plate signal CP to cell plate electrodes, potentials of bit lines BL0 and /BL0 are respectively set to logic voltage H and L by a sense amplifier. That is, for the cell plate electrode, an electric field is once applied to the ferroelectric capacitor, and the signal application is controlled so as not to apply electric field afterwards, and the potentials of the bit lines are amplified by the sense amplifier.

22 Claims, 28 Drawing Sheets

DATA READING METHOD OF FERROELECTRIC MEMORY DEVICE, AND FERROELECTRIC MEMORY DEVICE

This application is the U.S. national-phase application of PCT International Application No. PCT/JP97/00882.

TECHNICAL FIELD

The present invention relates to a reading method of ferroelectric memory device, and a ferroelectric memory device.

BACKGROUND ART

Recently, by using a ferroelectric material in the capacitor of memory cell, a ferroelectric memory device realizing nonvolatility of stored data is devised. The ferroelectric capacitor has a hysteresis characteristic, and if the electric field is zero, a residual polarization of different polarity depending on the hysteresis is left over. By expressing the stored data by the residual polarization of the ferroelectric capacitor, a nonvolatile memory device is realized.

The specification of U.S. Pat. No. 4,873,664 discloses two types of ferroelectric memory device. In a first type, a memory cell is composed of one transistor and one capacitor per bit (1T1C), and a reference memory cell is provided in, for example, every 256 main body memory cells (normal cells). In a second type, without using reference memory cell, a memory cell is composed of two transistors and two capacitors per bit (2T2C), in which a pair of complementary data are stored in a pair of ferroelectric capacitors.

As the ferroelectric material for composing capacitor, $KNO_3$, $PbLa_2O_3$—$ZrO_2$—$TiO_2$, and $PbTiO_3$—$PbZrO_3$ are known among others. According to PCT International Disclosure No. WO93/12542 Publication, ferroelectric materials extremely small in fatigue as compared with $PbTiO_3$—$PbZrO_3$ suited to ferroelectric memory device are also known.

For example, the constitution of ferroelectric memory device in 2T2C composition and its conventional operation mode are briefly described below. FIG. 31 is a memory cell block diagram, FIG. 32 is a sense amplifier circuit diagram, FIG. 33 is an operation timing chart, FIG. 34 is an operation hysteresis characteristic diagram of ferroelectric capacitor, and FIG. 35 is a relation diagram of supply voltage and bit line voltage when reading out data.

In FIG. 31, C00 to C37 refer to ferroelectric capacitors, CPD is a cell plate driver, SA0 to SA3 are sense amplifiers, CP is a cell plate signal, WL0 to WL3 are word lines, and BL0 to BL3, /BL0 to /BL3 are bit lines. In FIG. 32, BP is a bit line precharge signal, /SAP, SAN are sense amplifier control signals, VSS is a grounding voltage, and VDD is a supply voltage.

In FIG. 34, points A to F refer to hysteresis characteristics when positive and negative electric fields are applied to both electrodes of the ferroelectric capacitor, and points P901 to P903 indicate the reading state of the ferroelectric capacitor.

In the memory cell composition, for example, bit lines BL0 and /BL0 are connected to the sense amplifier SA0, and ferroelectric capacitors C00, C01 are connected to the bit lines BL0 and /BL0 through an N-channel MOS transistor having word line WL0 as its gate. The ferroelectric capacitors C00, C01 are connected to the cell plate signal CP which is driven by the cell plate driver CPD. The sense amplifier SA0 is driven by sense amplifier control signals /SAP, SAN, and the circuit is thus composed so that precharge of bit lines BL0 and /BL0 is controlled by the bit line precharge signal BP.

The operation is further described by referring to FIG. 33 and FIG. 34.

First, the bit lines BL0 and /BL0 are precharged to logic voltage L by the bit line precharge signal BP. Then the bit line precharge signal BP is set to logic voltage L, and the bit lines BL0 and /BL0 come into floating state.

The initial states of the ferroelectric capacitors C00 and C01 are as indicated by point B and point E in FIG. 34, respectively. Consequently, the word line WL0 is set to logic voltage H, and the cell plate signal CP to logic voltage H. Herein, the potential level of the logic voltage H of the word line WL0 is a voltage boosted above the supply voltage VDD. At this time, an electric field is applied to both electrodes of the ferroelectric capacitors C00 and C01, and potentials determined by the capacity ratio of the capacity of the ferroelectric capacitor and the bit line capacity including the parasitic capacity are produced in the bit lines BL0 and /BL0. The both voltages are read out to be data. The states of the ferroelectric capacitors C00 and C01 are as indicated by point P901 and point P902 in FIG. 34.

Afterwards, by setting the sense amplifier control signal /SAP to logic voltage L and SAN to logic voltage H, the sense amplifier SA0 is put in operation. As a result, the potentials being read out from the bit lines are amplified to the supply voltage VDD and grounding voltage VSS. That is, by the operation of the sense amplifier SA0, the supply voltage VDD is applied to the bit line BL0 showing the higher potential, of the potentials being read out from the bit Lines BL0 and /BL0. As a result, the potential of the bit line BL0 is changed to logic voltage H. At the same time, the grounding voltage VSS is applied to the bit line /BL0 showing the lower potential, and the potential of the bit line /BL0 is changed to logic voltage L. In this way, the potentials of the both bit lines can be varied to the logic voltage H and L, depending on the difference in their potential. That is, the potential difference of the two bit lines is amplified to the potential difference of the supply voltage VDD and grounding voltage VSS by the sense amplifier SA0. Such operation is only mentioned in this specification that the potentials being read out from the bit lines are amplified to the supply voltage VDD and grounding voltage VSS.

At this time, the states of the ferroelectric capacitors C00 and C01 are respectively point P903 and point D in FIG. 34.

Next, as the rewriting operation, consequently, the cell plate signal CP is set to logic voltage L. This rewriting operation is intended to prevent decrease of polarization level of ferroelectric capacitor, so that the next reading operation may be done smoothly. The states of the ferroelectric capacitors C00 and C01 are respectively point A and point E in FIG. 34.

Later, stopping the sense amplifier, the bit lines BL0 and /BL0 are precharged to logic voltage L by the bit line precharge signal BP. The states of the ferroelectric capacitors C00 and C01 are respectively point B and point E in FIG. 34.

As this reading operation, setting the cell plate signal CP to logic voltage H, the relation between the potentials of the bit lines BL0 and /BL0 and the supply voltage when data is read out into the bit lines BL0 and /BL0 is shown in FIG. 35. The broken line shown in FIG. 35 refers to the potential of the bit line BL0 when the potential level of the logic voltage H of the word line WL0 is sufficiently higher than the supply voltage VDD and there is no effect of threshold value of the memory cell transistor. Actually, as indicated by solid line, the potential is lower than the dotted line potential.

In the conventional ferroelectric memory device of 2T2C composition, however, the potential being read out into the bit line may be lowered by the effects of threshold value of the memory cell transistor as described above, and in this case, therefore, the potential difference between a pair of bit lines, that is, the potential difference between the bit lines BL0 and /BL0 becomes small. In particular, the effect is significant at low voltage, and the low voltage operation may be difficult.

To solve this problem, if the word line is boosted, the circuit is complicated, also boosting of the word line by high supply voltage brings about another problems in the withstand voltage of the memory cell transistor and others.

As the bit line logic voltage L side operation in the reading operation, for the ferroelectric capacitor, a same voltage as the supply voltage is applied in one direction, it is disadvantageous for the life of the number of times of reading of the ferroelectric capacitor. These problems are not limited to the ferroelectric memory device of 2T2C composition alone, but are commonly seen also in the ferro,electric memory device of 1T1C composition.

DISCLOSURE OF THE INVENTION

In the light of the problems of the prior art, it is hence an object of the invention to present a reading method of ferroelectric memory device assuring low voltage operation more reliability than ever, and a ferroelectric memory device.

To attain the object, a data reading method of ferroelectric memory device of the present invention is a reading method of data stored in a ferroelectric memory device comprising a memory cell transistor having a gate connected to a word line and a drain connected to a bit line, a ferroelectric capacitor storing data, having a first electrode connected to a cell plate and a second electrode connected to the source of the memory cell transistor, and potential changing means connected to the bit line, wherein a series of operation for transferring the cell plate from a first potential to a second potential and further transferring from the second potential to the first potential is carried out at least once, and the potential of the bit line is changed to a specified value by the potential changing means, and the specified value is read out.

A data reading method of ferroelectric memory device of the present invention determines on the basis of the value of the bit line capacity of the bit line and/or the specified supply voltage value of the ferroelectric memory device whether the operation for changing to the specified value is done after the series of operation of the cell plate, or after transferring the cell plate from the first potential to the second potential.

A ferroelectric memory device of the present invention, comprises a memory cell transistor having a gate connected. to a word line, and a drain connected to a bit line, a cell plate for transferring to a specified potential, a ferroelectric capacitor storing data, having a first electrode connected to the cell plate and a second electrode connected to the source of the memory cell transistor, a sense amplifier connected to the bit line, and control means for transferring the cell plate from a. first potential to a second potential, and transferring from the second potential to the first potential, and getting the sense amplifier to change the potential of the bit line to a specified value.

A ferroelectric memory device of the present invention, comprises a memory cell transistor having a gate connected to a word line, and a drain connected to a bit line, a ferroelectric capacitor having a first electrode connected to a cell plate, and a second electrode connected to the source of the memory cell transistor, a sense amplifier connected to the bit line, a voltage detecting circuit for detecting a specified voltage, and a control circuit for controlling driving of the cell plate on the basis of the detected voltage, wherein the control circuit changes over to either driving mode of a first driving mode for transferring and driving the cell plate, or a second driving mode of driving the cell plate by pulses, depending on whether the result of detection by the voltage detecting circuit satisfies a specified standard or not.

In this constitution, the invention presents a reading method in which, for example, a cell plate signal is driven by pulse, an electric field is applied in one direction of a ferroelectric memory cell capacitor, and further the electric field is not applied or applied in reverse direction, thereafter the sense amplifier is driven, thereby increasing the voltage difference of reading bit lines, or a reading method in which the sense amplifier is driven after transition of cell plate signal plural times, thereby increasing the voltage difference of reading bit lines. Moreover, by selectively employing these driving methods depending on the supply voltage detection signal, the voltage difference of reading bit lines can be increased in a wide supply voltage range. Still more, in the reading method of transition of cell plate signal plural times, the number of times of transition can be optimized in consideration of the current consumption, so that the voltage in transition of cell plate signal may be optimized.

REFERENCE NUMERALS

Figure 1:
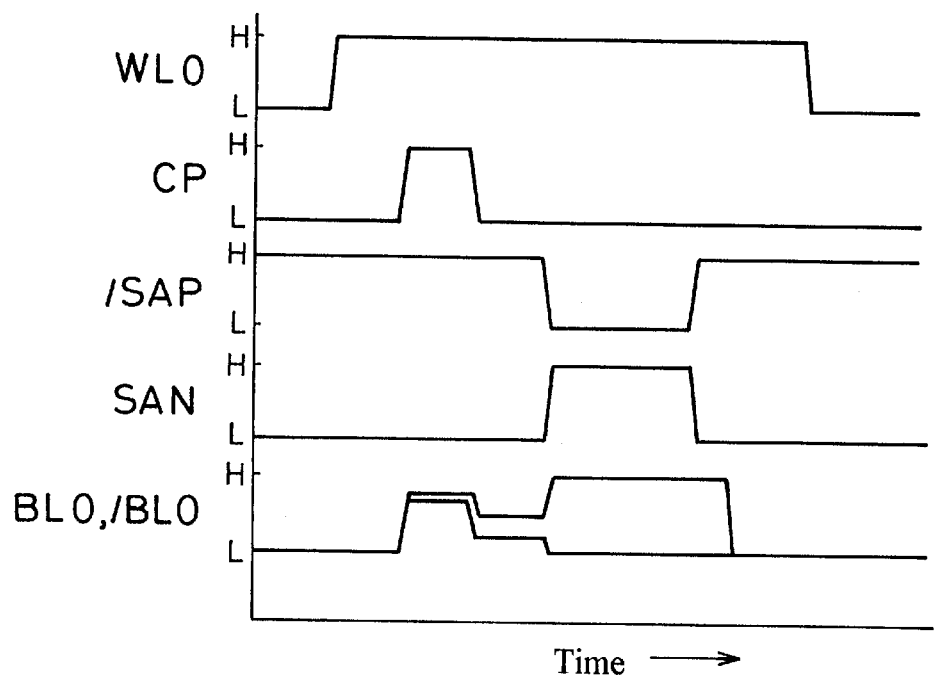
FIG. 1 is an operation timing diagram of a ferroelectric capacitor in a first embodiment of the invention.

1 Memory cell
2 Bit line precharge circuit
3 Sense amplifier
4 Reference voltage generating circuit
P201–P203, P401–P403, P901–P903 Points showing reading state of ferroelectric capacitor
C0–C9, C00–C09, C10–C37 Ferroelectric capacitor
CPD Cell plate driver
SA0–SA3 Sense amplifier
CP Cell plate signal
WL, WL0–WL3 Word line
BL, /BL, BL0–BL3, /BL0–/BL3 Bit Line
BP Bit line precharge signal
/SAP, SAN, SAE Sense amplifier control signal
VSS Grounding voltage
VDD Supply voltage
RCP Reference cell plate signal
RWL Reference word line
EQ0, EQ1 Bit line equalizing signal
INV NOT circuit
Qn0–Qn27 N-channel type MOS transistor
Qp21–Qp23 P-channel type MOS transistor
t11–t218 Time L1H–L3H, L1L–L3L Line showing bit line capacity
H11–H215, L11–L215 Point showing state of ferroelectric capacitor in individual operating states
VH1–VH21 Reading voltage H
VL1–VL21 Reading voltage L
ΔV–ΔV21 Reading potential difference

BEST MODE FOR CARRYING OUT THE INVENTION

Referring now to the drawings, embodiments of the invention are described below.

(Embodiment 1)

An embodiment of a ferroelectric memory device of the invention is described below by referring to the accompanying drawings.

Figure 2:
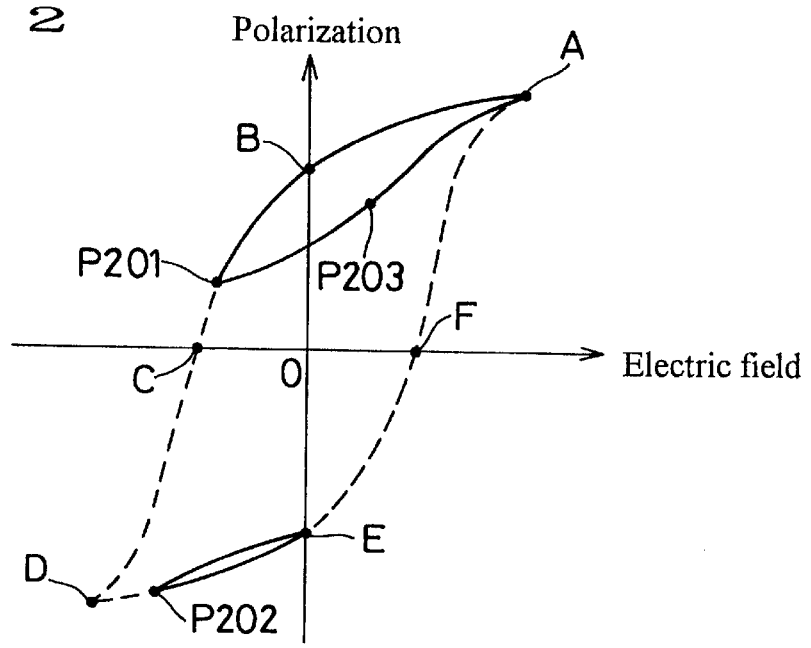
FIG. 2 is a hysteresis characteristic diagram of the ferroelectric capacitor in the first embodiment of the invention.
Figure 5:
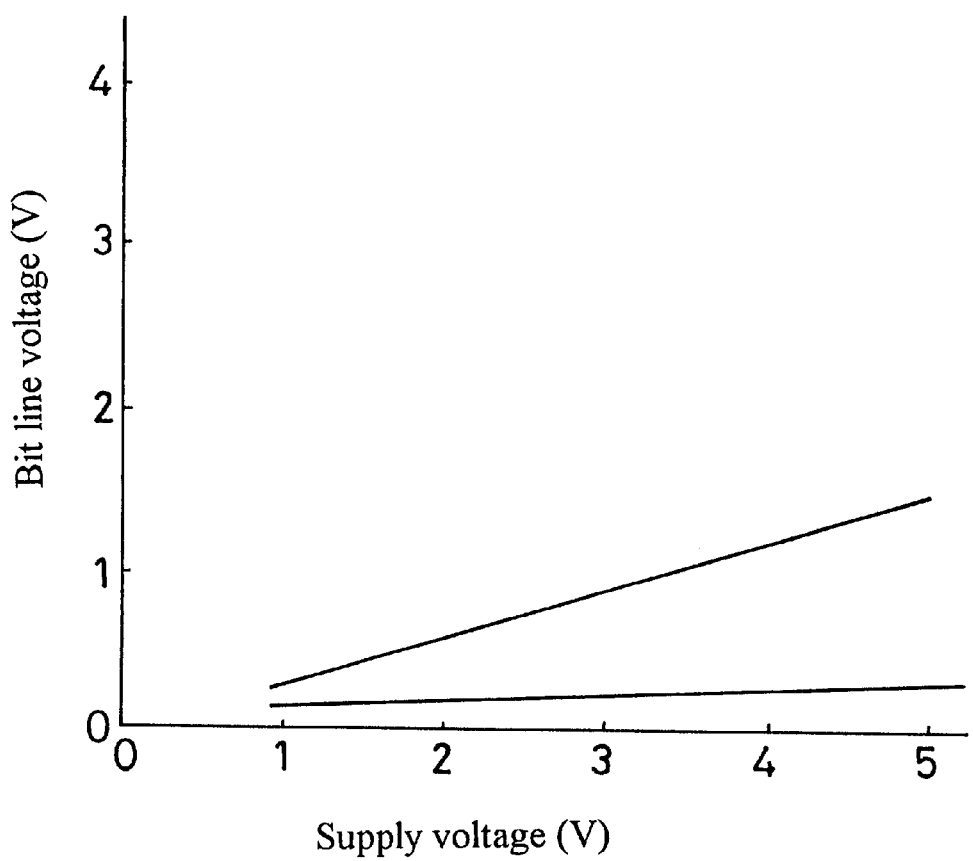
FIG. 5 is a relation diagram of supply voltage and bit line voltage when reading out data in the first embodiment of the invention.

That is, FIG. 1 is an operation timing diagram of a ferroelectric capacitor in a first embodiment of the invention, FIG. 2 is a hysteresis characteristic diagram of the ferroelectric capacitor, and FIG. 5 is a relation diagram of supplyvoltage and bit line voltage when reading out data.

Figure 31:
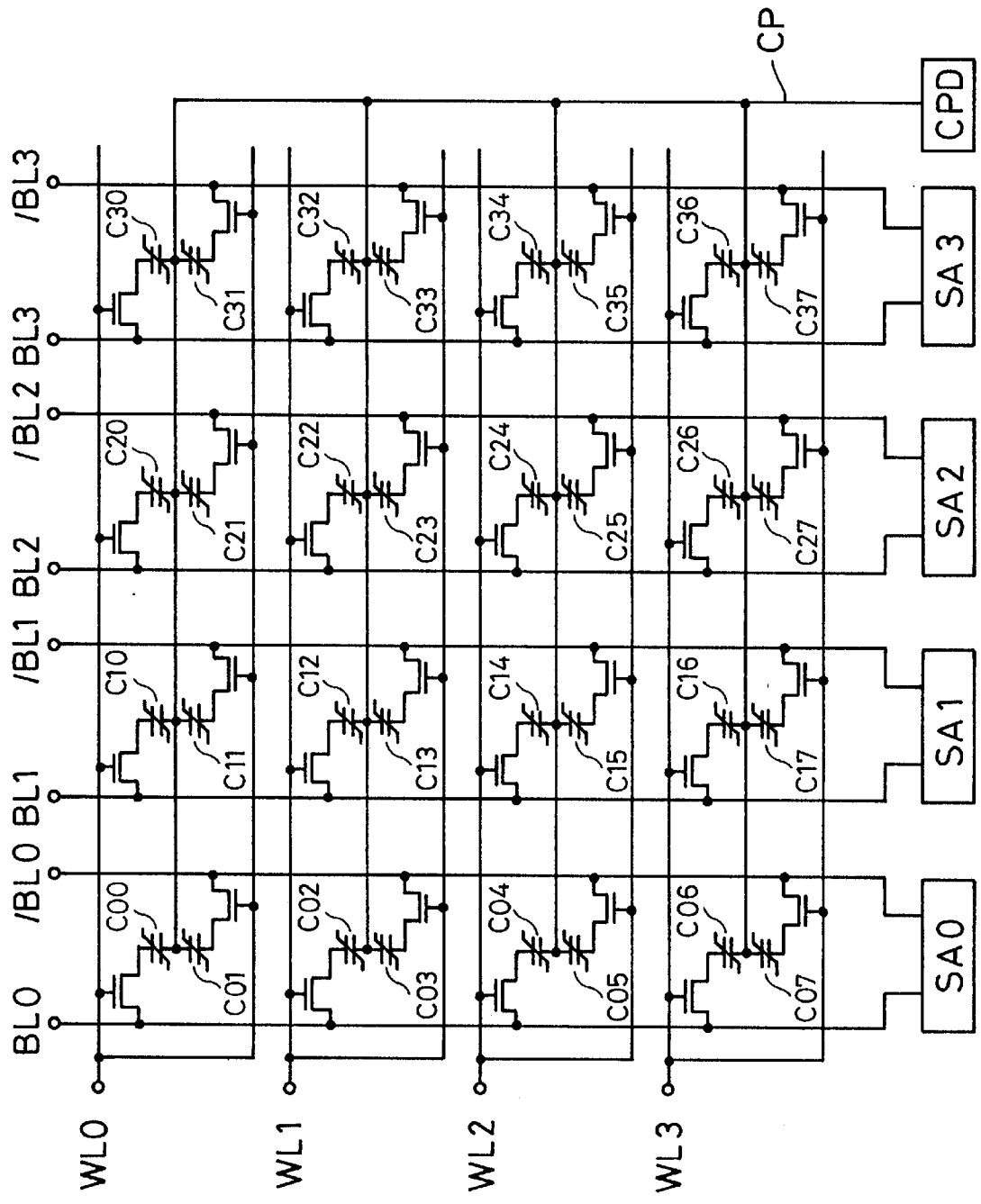
FIG. 31 is a diagram showing an example of constitution of a memory cell.
Figure 32:
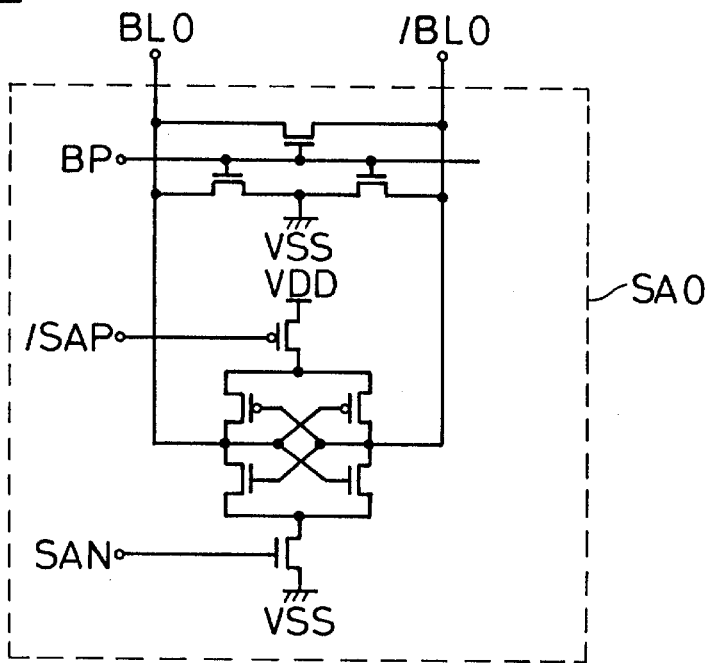
FIG. 32 is a diagram showing an example of constitution of a sense amplifier circuit.
Figure 33:
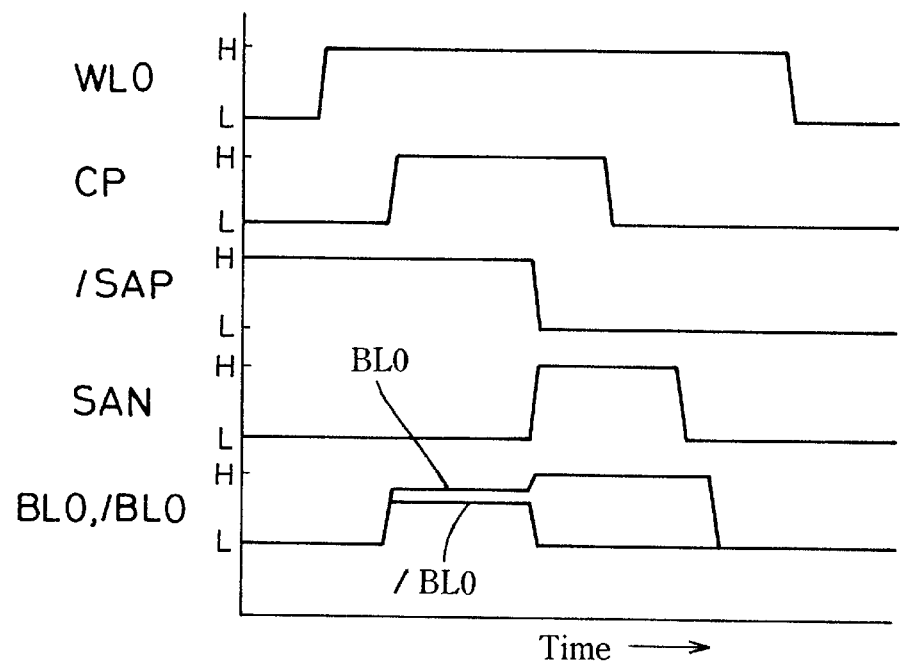
FIG. 33 is an operation timing diagram of the prior art.
Figure 34:
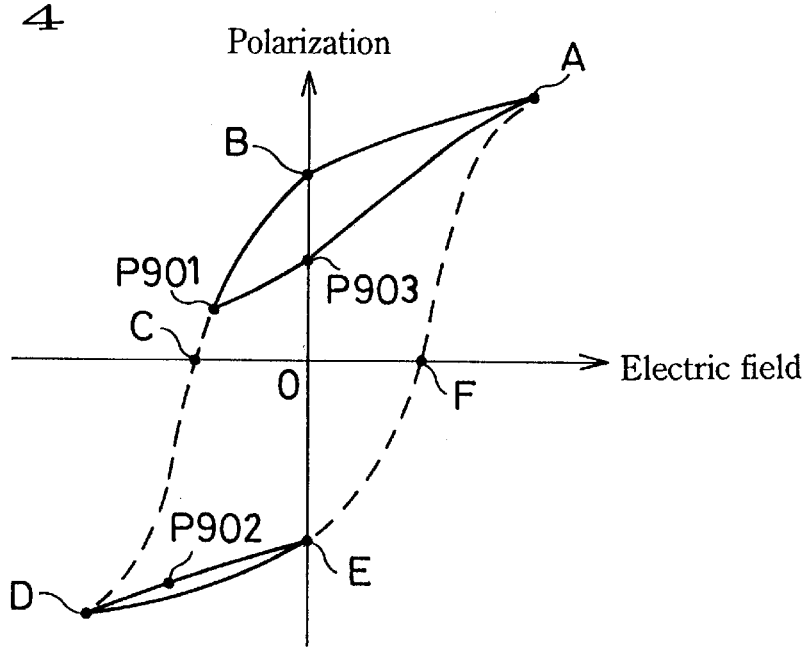
FIG. 34 is a hysteresis characteristic diagram of the ferroelectric capacitor in the prior art.
Figure 35:
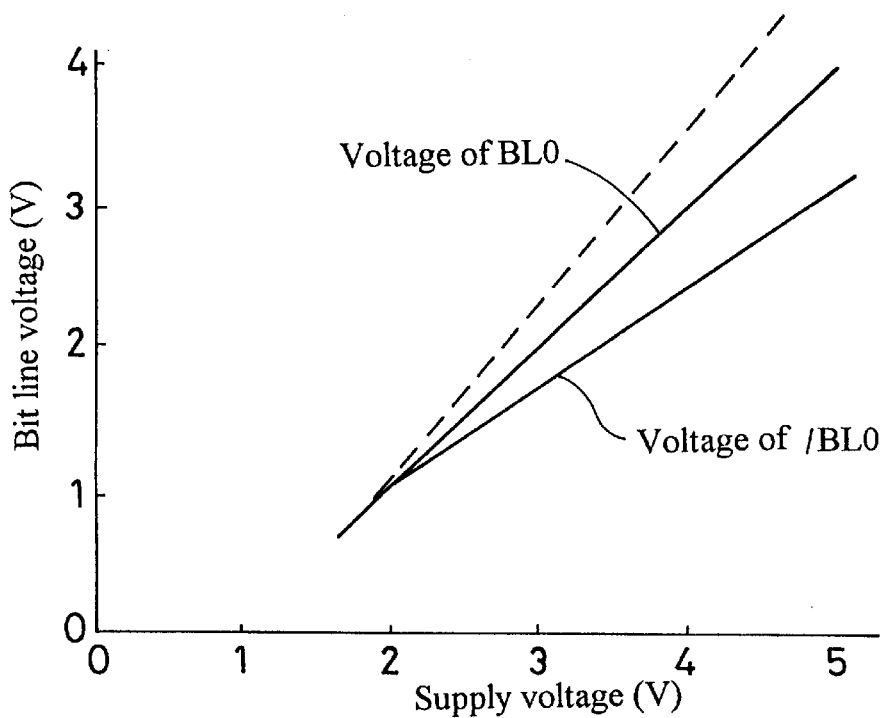
FIG. 35 is a relation diagram of supply voltage and bit line voltage when reading out data in the prior art.

The composition of the memory cell is same as in the prior art, as shown in FIG. 31. The circuit diagram of the sense amplifier is also same as in the prior art, as shown in FIG. 32. Therefore, the description of circuit construction of the ferroelectric memory device of the embodiment is omitted. However, the control circuit (not shown) for controlling the sense amplifier or cell plate signal CP is different from the prior art. It is referred to below in the description of the operation.

Incidentally, in FIG. 2, points A to F show the hysteresis characteristics when positive and negative electric fields are applied to both electrodes of the ferroelectric capacitor, and points P201 to P203 are points indicating the reading state of the ferroelectric capacitor.

The potential Changing means of the invention corresponds to the sense amplifiers SA0 to SA3 shown in FIG. 31.

The operation of the embodiment is described below while referring to FIG. 1 and FIG. 2, and an embodiment of data reading method of the ferroelectric memory device of the invention is described at the same time.

First, when the bit line precharge signal BP (not shown) is H, the bit lines BL0 and /BL0 are precharged to logic voltage L.

Next, when the bit line precharge signal BP is set to L, the bit lines BL0 and /BL0 come into floating state. The initial states of the ferroelect-ric capacitors C00 and C01 are the states corresponding to point B and point E, respectively, as shown in FIG. 2.

Next, by an instruction from the control circuit (not shown), the word line WL0 is set to logic voltage H, and the cell plate signal CP to logic voltage H. Herein, the potential level of the word line WL0 logic voltage H is over the supply voltage VDD. Hence, the voltage applied to the ferroelectric capacitor is a voltage lower by the threshold voltage of the memory cell transistor from the voltage boosted over the supply voltage VDD. For example, when the supply voltage VDD is 3.0 V, the boosted voltage is 4.0 V, and the threshold voltage is 1.5 V, the voltage applied to the ferroelectric capacitor is 4.0−1.5=2.5 V. When the boosted voltage is higher than the supply voltage VDD by more than the threshold voltage of the memory cell transistor, for example, if the boosted voltage is 3.0+1.5=4.5 V or more, the voltage applied to the ferroelectric capacitor is the supply voltage VDD (3.0 V).

At this time, an electric field is applied to both electrodes of the ferroelectric capacitors C00 and C01, and the potentials determined by the capacity ratio of the capacity of the ferroelectric capacitor and the bit line capacity including the parasitic capacity are produced in the bit lines BL0 and /BL0. At this time, the states of the ferroelectric capacitors C00 and C01 are the states corresponding to point P201 and point P202 shown in FIG. 2, respectively.

By an instruction from the control circuit, the cell plate signal CP is set to logic voltage L. At this time, the potentials being read out in the bit lines BL0 and/BL0 are lowered, but the mutual potential difference can be further increased from the state before the cell plate signal CP is logic voltage L. If there is an effect of threshold value of the memory cell transistor, the effect can be decreased. The reason is as follows.

That is, since the bit line potential is lowered, the potential difference between the gate voltage of the memory cell transistor connected to the word line, and the drain or source of the memory cell transistor connected to the bit line increases, so that the effect of the threshold value becomes smaller. If this potential difference, that is, the potential difference between the word line and bit line is more than the threshold value, there is hardly any effect of the threshold value.

Herein, the states of the ferroelectric capacitors C00 and C01 nearly correspond to point P203 and point E in FIG. 2.

Afterwards, the sense amplifier control signal /SAP issued from the control circuit is set to logic voltage L and SAN to logic voltage H, and the sense amplifier SA0 is operated. As a result, the potentials being readout from the bit lines are amplified into the supply voltage VDD and grounding voltage VSS, and rewriting operation is effected. The states of the ferroelectric capacitors C00 and C01 are point A and point E in FIG. 2. The control means of the invention corresponds to the control circuit mentioned above.

Herein, in the state of point A, as described above, since the word line WL0 is sufficiently boosted, the voltage of the supply voltage VDD is applied to the ferroelectric capacitors.

Later, stopping the operation of the sense amplifier by the signal from the control circuit, the bit line precharge signal BP is changed from L to H, so that the bit lines BL0 and /BL0 are precharged to the logic voltage L. The states of the ferroelectric capacitors C00 and C01 are point B and point E in FIG. 2.

In this reading operation, after setting the cell plate signal CP to logic voltage H and then setting the cell plate signal CP to logic voltage L, when the data is read out into the bit lines BL0 and /BL0, the relation between the potentials of the bit lines BL0 and /BL0 and the supply voltage is shown in FIG. 5. As shown in FIG. 5, the potential difference between the bit lines BL0 and /BL0 is a larger voltage than in the prior art.

Incidentally, when the cell plate signal CP is set to logic voltage L, the sense amplifier does not operate. Accordingly, the bit lines are in floating state, the load is small, the operation is fast, and hence the power consumption is small.

Simultaneously with the operation of the sense amplifier, it is also effective to rewrite data into the ferroelectric capacitors. Actually, the operation lower limit voltage can be lowered from 2.0 V to about 1.5 V, and hence reduction of voltage is enabled.

In the reading operation, moreover, in the ferroelectric capacitor C01, only a voltage lower than the supply voltage is applied at the point of P202, and it is also advantageous more than in the prior art in the aspect of life of number of times of reading of the ferroelectric capacitor.

Figure 3:
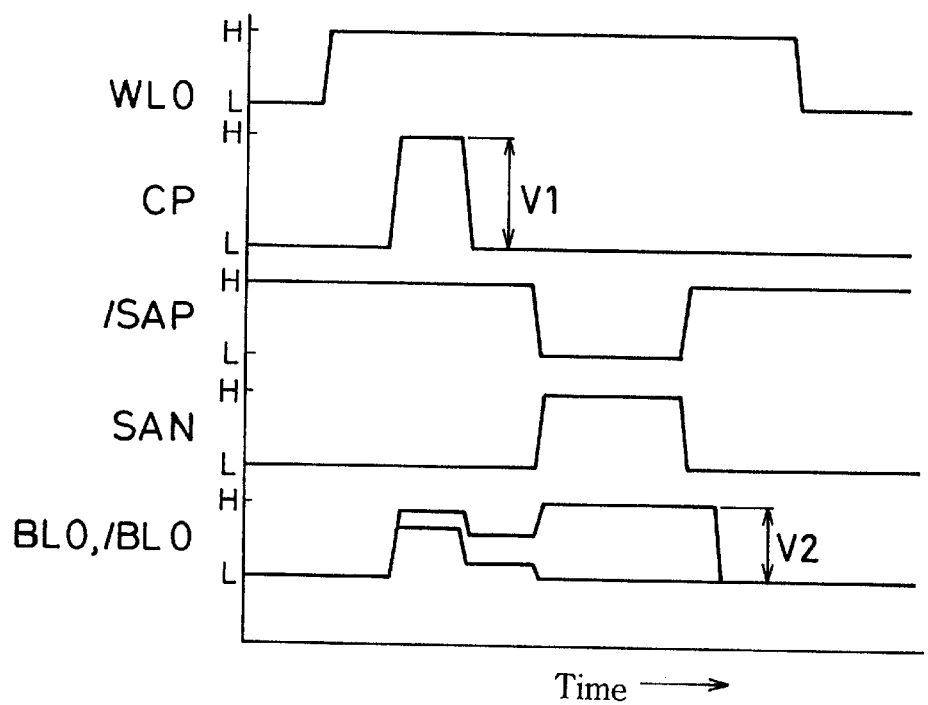
FIG. 3 is an operation timing diagram of the ferroelectric capacitor in other example of the same embodiment.
Figure 4:
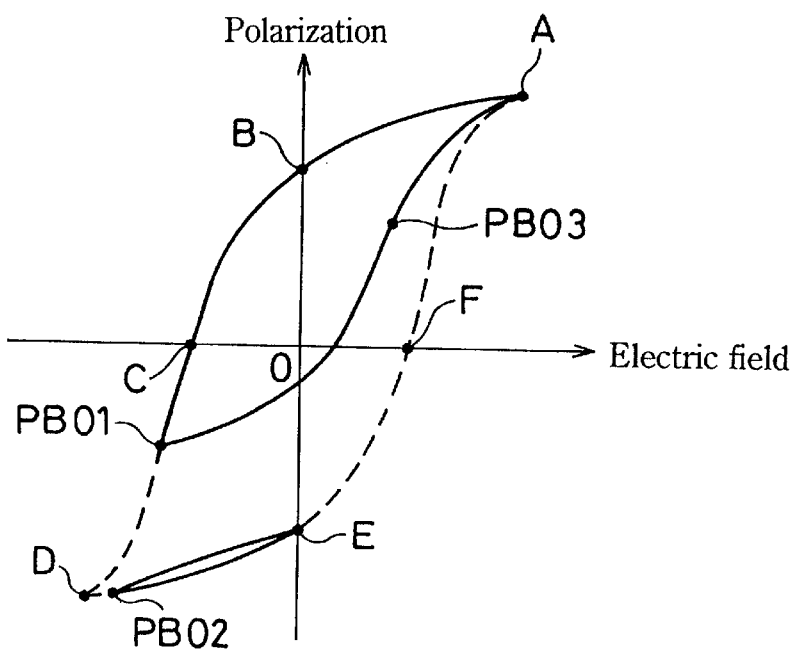
FIG. 4 is a hysteresis characteristic diagram of the ferroelectric capacitor in other example of the same embodiment.

A case of increasing the driving voltage of the cell plate signal CP shown in FIG. 1 more than the driving voltages of the bit lines BL0 and /BL0 is explained while referring to FIG. 3 and FIG. 4. Herein, FIG. 3 and FIG. 4 correspond to FIG. 1 and FIG. 2 respectively. That is, FIG. 3 is an operation timing diagram of the ferroelectric capacitor in the embodiment, and FIG. 4 is a hysteresis characteristic diagram of the operation of this ferroelectric capacitor.

That is, as shown in FIG. 3, by setting the voltage level of the logic voltage H of the cell plate signal CP larger than the driving voltage of the sense amplifier (herein, the supply voltage VDD), the potential difference of the bit line BL0 and bit line /BL0 can be set larger than in FIG. 1. In this case, therefore, as compared with the example of the operation shown in FIG. 1, the data reading potential difference is larger, so that a further lower voltage operation is enabled.

(Embodiment 2)

Figure 6:
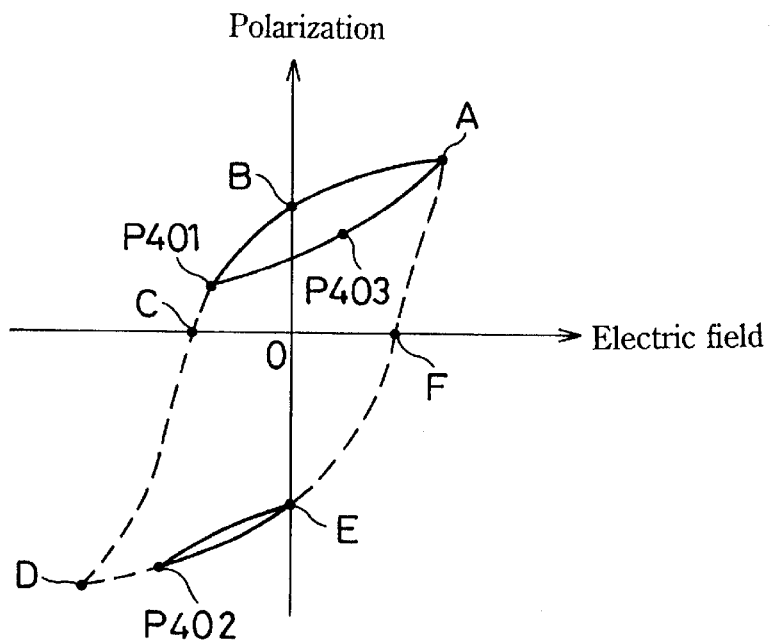
FIG. 6 is a hysteresis characteristic diagram of a ferroelectric capacitor in a second embodiment of the invention.

FIG. 6 is a hysteresis characteristic diagram of a ferroelectric capacitor in a second embodiment of the invention, and this embodiment is; described below by referring to the diagram.

That is, in the diagram, points A to F indicate the hysteresis characteristics when positive and negative electric fields are applied to both electrodes of the ferroelectric capacitor, and points P401 to P403 show the reading state of the ferroelectric capacitor.

The operation timing in this embodiment is same as in the first embodiment shown in FIG. 1. It is a feature of this embodiment that the word line is not boosted different from the foregoing embodiment. That is, when rewriting or writing the H side data of the ferroelectric capacitor, a high voltage such as supply voltage is not applied in order to extend the life of the ferroelectric capacitor, in particular, the life of the number of times of reading and writing.

The operation of the embodiment is described below.

First, by the bit line precharge signal BP, the bit lines BL0 and /BL0 are precharged to logic voltage L. The initial states of the ferroelectric capacitors C00 and C01 are point B and point E in FIG. 6

Consequently, the word line WL0 is set to logic voltage H, and the cell plate signal CP to logic voltage H. Herein, the potential level of the logic voltage H of the word line WL0 is the supply voltage VDD. The voltage applied to the ferroelectric capacitor is a voltage lower than the supply voltage VDD by the threshold voltage of the memory cell transistor. At this time, an electric field is applied to both electrodes of the ferroelectric capacitors C00 and C01 and the potentials determined by the capacity ratio of the capacity of the ferroelectric capacitor and the bit line capacity including the parasitic capacity are produced in the bit lines BL0 and /BL0.

Next, by an instruction from the control circuit, the cell plate signal CP is set to logic voltage L. At this time, the potentials being read out in the bit lines BL0 and /BL0 are lowered, but their mutual potential difference is much greater than before the cell plate signal CP is set to logic voltage L. If there is an effect of threshold value of the memory cell transistor, its effect can be decreased. The states of the ferroelectric capacitors C00 and C01 are point P403 and point E shown in FIG. 6.

Then, same as in the first embodiment, the sense amplifier SA0 is put into operation. As a result, the potentials being read out in the bit lines are amplified to the supply voltage VDD and grounding voltage VSS, and rewriting operation is also effected. The states of the ferroelectric capacitors C00 and C01 are point A and point E in FIG. 6.

In this embodiment, as mentioned above, since the word line is not booster in the state at point A, only a voltage lower than the supply voltage VDD by the threshold voltage of the memory cell transistor is applied to the ferroelectric capacitors.

Later, stopping the sense amplifier, the bit lines BL0 and /BL0 are precharged to logic voltage L by the bit line precharge signal BP. The states of the ferroelectric capacitors C00 and C01 are the states corresponding to point B and point E shown in FIG. 6.

In the ferroelectric memory device of the embodiment, same as mentioned in the first embodiment, the applied voltage to the ferroelectric capacitor C01 in reading operation is lower than the supply, voltage VDD. Besides, in the cases of this ferroelectric memory device, in rewriting operation, only a voltage lower than the supply voltage VDD by the threshold value of the memory cell transistor is applied to the ferroelectric capacitor C00. It is accordingly effective to extend the life of the ferroelectric capacitors C00, C01. of the ferroelectric memory device, in particular, the Life of number of times of reading and writing. Further, in the rewriting operation, since the voltage applied to the ferroelectric capacitor is lower than the supply voltage VDD by the threshold voltage, the power consumption for driving is saved.

(Embodiment 3)

Figure 7:
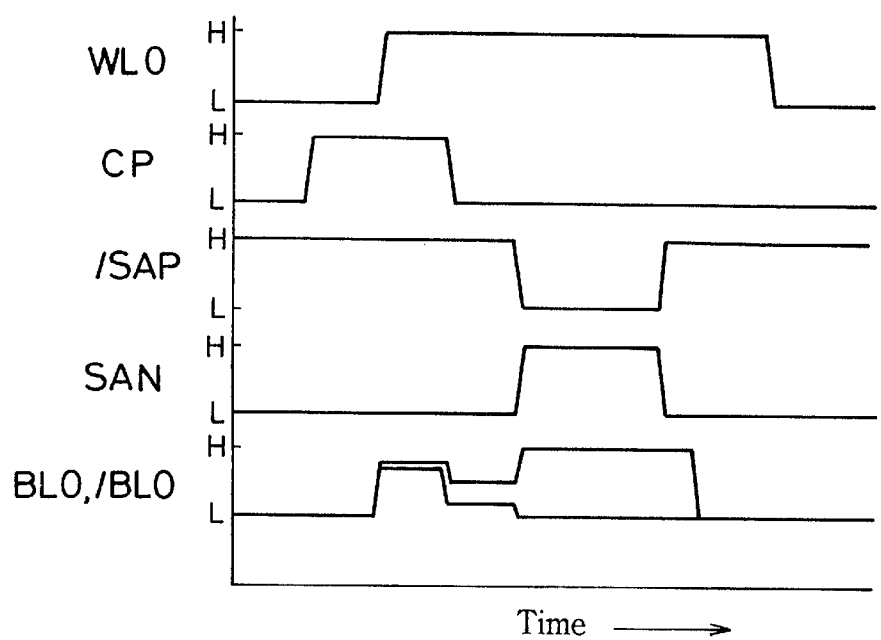
FIG. 7 is an operation timing diagram in a third embodiment of the invention.

FIG. 7 is an operation timing diagram in a third embodiment of the invention, and this embodiment is described below by referring to the diagram.

The hysteresis characteristic of operation of the ferroelectric capacitor in this embodiment is same as in the case of the second embodiment, and is described by referring to FIG. 6.

According to a feature of the embodiment, the cell plate signal is driven before selecting a word line, and when the word line is selected, the electric charge is immediately read out from the ferroelectric capacitor, so that high speed operation is realized. Incidentally, the operation timing of the sense amplifier SA0 is same as in the first and second embodiments.

The operation of the embodiment is described below.

First, the bit. lines BL0 and /BL0 are precharged to logic voltage L by the bit line precharge signal BP. The initial states of the ferroelectric capacitors C00 and C01 are point B and point E in FIG. 6.

Then, the cell plate signal CP is set to logic voltage H. At this time, the state of the ferroelectric capacitor is not changed particularly.

Next, the word line WL0 is set to logic voltage H. Herein, the potential level of the logic voltage H of the word line WL0 is the supply voltage VDD, but it is also possible to boost. At this time, since the cell plate signal CP is already the logic voltage H, an electric field is applied to both electrodes of the ferroelectric capacitors C00 and C01, and the potentials determined by the capacity ratio of the bit line capacity including the ferroelectric capacitor and parasitic capacity are produced in the bit lines BL0 and /BL0. These potentials are read out.

Next, the cell plate signal CP is set to logic voltage L. At this time, the potentials being read out in the bit lines BL0 and /BL0 are lowered, but their mutual potential difference is much greater because there is no effect of the threshold value of the memory cell transistor. The states of the ferroelectric capacitors C00 and C01 are nearly equal to point P403 and point E shown in FIG. 6.

Then, the sense amplifier is put into operation. As a result, the potentials being read out in the bit lines are amplified to the supply voltage VDD and grounding voltage VSS, and rewriting operation is also effected. The states of the ferroelectric capacitors C00 and C01 are point A and point E in FIG. 6. Since the word line is not boosted in the state at point A, only a voltage lower than the supply voltage VDD by the threshold voltage of the memory cell transistor is applied to the ferroelectric capacitors.

Later, stopping the sense amplifier, the bit lines BL0 and /BL0 are precharged to logic voltage L by the bit line precharge signal BP. The states of the ferroelectric capacitors C00 and C01 are the states corresponding to point B and point E shown in FIG. 6.

Thus, according to the ferroelectric memory device of the embodiment, simultaneously with the selection of the word line, since the electric charge is read out from the ferroelectric capacitors, so that high speed operation is realized. Moreover, by combining with the second embodiment, the both effects can be obtained.

So far is described the ferroelectric memory device in the 2T2C composition, but not limited to this composition, the same operating method is applied to the ferroelectric memory device in the 1T1C composition, and similar effects are obtained. Hereinafter, the above operation method of once raising the cell plate to H level, and lowering to L level to operate the sense amplifier is called the plate pulse drive operating method.

Thus, according to the foregoing embodiments, the potentials being read out in the bit lines from the ferroelectric memory cell capacitors are free from effects of threshold value of the memory cell transistor, and low voltage operation is enabled. In addition, the load in cell plate signal transition is also small, high speed operation is possible, so that a ferroelectric memory device of low power consumption is realized.

In the foregoing embodiments, meanwhile, when the value of the bit line capacity and the value of the supply voltage are within the specified condition, in particular as described later, it is possible to operate effectively when the bit line capacity is small or the supply voltage is small. However, the bit line capacity or supply voltage of the ferroelectric memory device may fluctuate during operation, or the set values may be changed intentionally. Anyway, as the bit line capacity or supply voltage changes, the above potential difference between bit lines is also changed.

Hence, considering the changes of the bit line capacity or supply voltage, an embodiment of execution of the above plate pulse drive operation is described below.

Prior to explanation of the embodiment, the change of potential difference between bit lines due to change in the bit line capacity or supply voltage is described first by referring to the conventional constitution.

That is, in the ferroelectric memory device of the conventional 2T2C composition, the constitution and operation are briefly described below.

Figure 27:
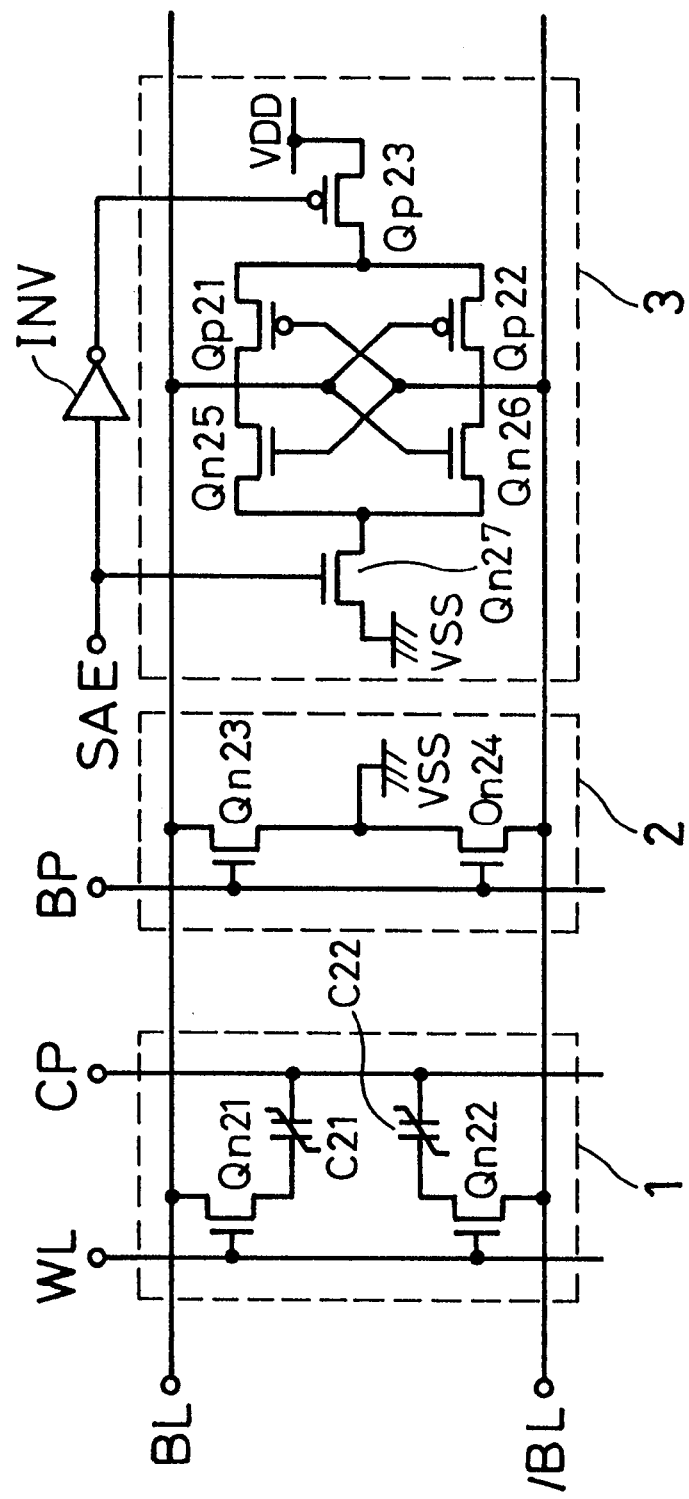
FIG. 27 is a memory cell block diagram of 2T2C type.
Figure 28:
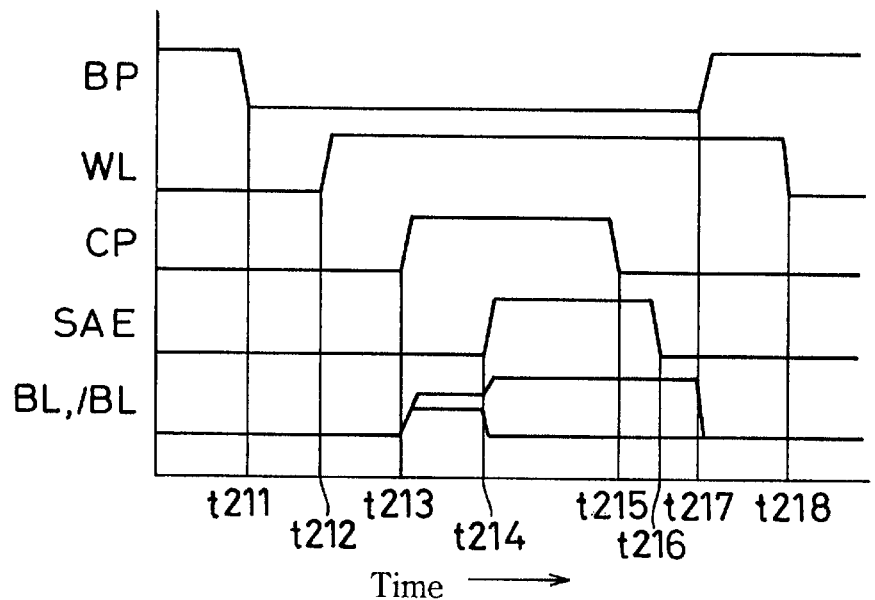
FIG. 28 is an operation timing diagram of a prior art.
Figure 29:
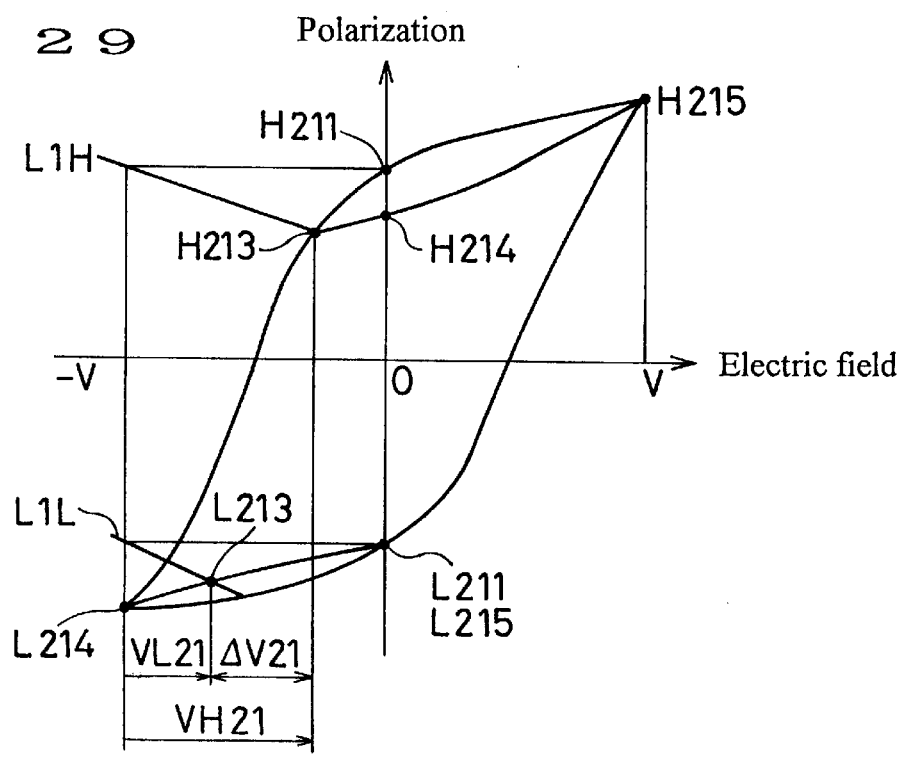
FIG. 29 is a hysteresis characteristic diagram of the ferroelectric capacitor in the prior art.
Figure 30:
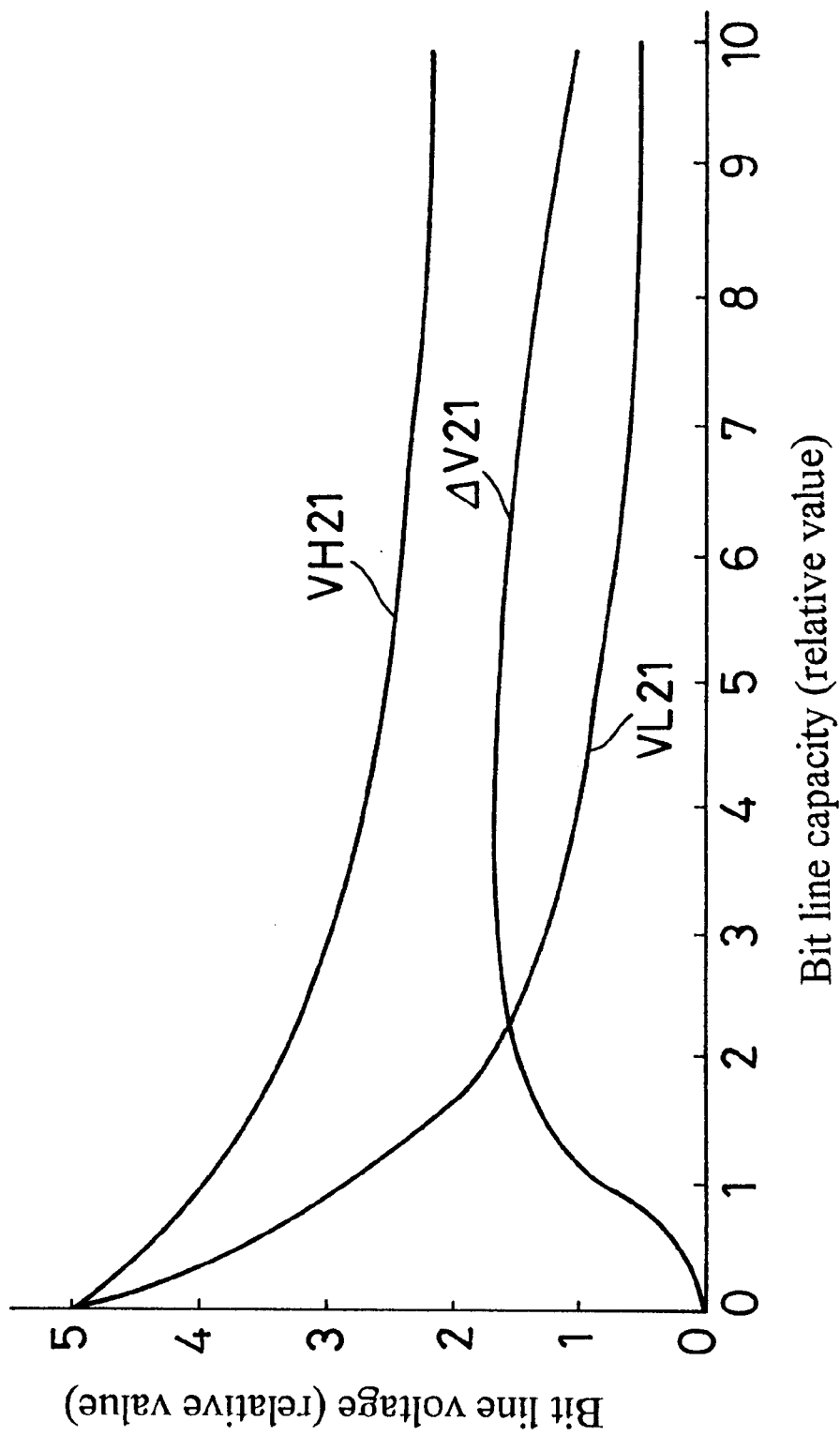
FIG. 30 is a relation diagram of the bit line capacity and bit line voltage in the prior art.

FIG. 27 is a block diagram of memory cell and its peripheral circuit, FIG. 28 is an operation timing diagram, FIG. 29 is a hysteresis characteristic diagram of the ferroelectric capacitor, and FIG. 30 is a relation diagram of the bit line capacity and bit line voltage. In the diagrams, C21 and C22 are ferroelectric capacitors, and CP is a cell plate. WL is a word line, and BL, /BL are bit lines. BP is a bit line precharge signal, SAE is a sense amplifier control signal, and VSS is a grounding voltage. INV is a NOT circuit, Qn21 to Qn27 are N-channel MOS transistors, and Qp21 to Qp23 are P-channel MOS transistors. Reference numeral 1 is a memory cell, 2 is a bit line precharge circuit, and 3 is a sense amplifier. Moreover, t211 to t218 denote the time (timing), and L1H, L1L are lines showingthe bit line capacity. H211 to H215, and L211 to L215 are points indicating the state of the ferroelectric capacitor in various states. Besides, VH21 is reading voltage of H, VL21 is reading voltage of L, and ΔV21 is a reading potential difference.

In the circuit composition, the bit lines BL and /BL are connected to the sense amplifier 3, and ferroelectric capacitors C21, C22 are connected to the bit lines BL, /BL, respectively through N-channel MOS transistors Qn21, Qn22 having the word line WL as the gate. The ferroelectric capacitors C21, C22 are further connected to the cell plate signal CP. The sense amplifier 3 is controlled by the sense amplifier control signal SAE, and thus the circuit is composed so that the bit lines BL and /BL are precharged by the bit line precharge signal BP.

The operation of thus constituted ferroelectric memory device of 2T2C type is described below while referring to FIG. 28 and FIG. 29.

First, the bit Lines BL and /BL are precharged to logic voltage L by the bit line precharge signal BP. At this time, the initial states of the ferroelectric capacitors C21 and C22 are point H211 and point L211 in FIG. 29.

At time t211, the bit lines BL and /BL are set in floating state, arld at time t212, the word line WL is set to logic voltage H, and further at time t213, the cell plate signal CP is set to logic voltage H. Herein, the potential level of the logic voltage H of the word line WL is a voltage boosted over the supply voltage VDD. At this time, an electric field is applied to both electrodes of the ferroelectric capacitors C21 and C22, and the potentials determined by the capacity ratio of the bit line capacitor including the ferroelectric capacitors and parasitic capacity are produced in the bit lines BL and /BL. The states of the ferroelectric capacitors C21 and C22 are point H213 and pcint L213 in FIG. 29.

At time t214, the sense amplifier control signal SAE is set to logic voltage H, and the sense amplifier is put into operation. As a result, the potentials being read out in the bit lines are amplified to the supply voltage VDD and grounding voltage VSS. The states of the ferroelectric capacitors C21 and C22 are point H214 and point L214 in FIG. 29.

At time t215, as rewriting operation, the cell plate signal CP is set to logic voltage L. The states of the ferroelectric capacitors C21 and C22 are point H215 and point L215 in FIG. 29.

Afterwards, stopping the sense amplifier, the bit lines BL and /BL are precharged to logic voltage L by the bit line precharge signal BP. The states of the ferroelectric capacitors C21 and C22 are point H211 and point L211 in FIG. 29.

In FIG. 30, the relation between the bit line capacity and bit line voltage in reading operation is described. The bit line voltage in the reading operation varies depending on the bit line capacity. This aspect is shown in FIG. 29, in which the reading bit line voltages VH21, VL21 are varied by the change of the inclination (bit line capacity) of the line L1H and line L1L showing the bit line capacity. Accordingly, the bit line voltage difference ΔV21 of the bit lines BL and /BL is also changed. From the relation diagram of the bit line capacity and bit line voltage in reading operation in FIG. 30, it is also known that the bit line voltage difference ΔV21 of the bit lines BL and /BL has a maximum value. When having the maximum value, the bit line capacity value is related with the memory cell capacity, which is determined by the ratio of the bit line capacity and memory cell capacity.

By thus optimizing the bit line capacity value, the bit line voltage difference ΔV21 of the bit lines BL and /BL can be increased, and the operation of the sense amplifier can be stabilized. In the actual device, however, since the bit line capacity may be very small depending on the circumstances, and the reading bit line voltage difference of the bit lines BL and /BL may be very small, so that the Low voltage operation may be difficult.

Accordingly, considering such change in the bit line voltage difference, for example, when the bit line capacity is small or when the supply voltage is low, the plate pulse drive operating method is employed, and in the other conditions, the conventional plate transition operating method is employed by changing over the driving method, which is described below. Other embodiments are also described specifically below.

Referring now to the drawings, the embodiments of the ferroelectric memcry device of the invention are described below.

(Embodiment 4)

Figure 8:
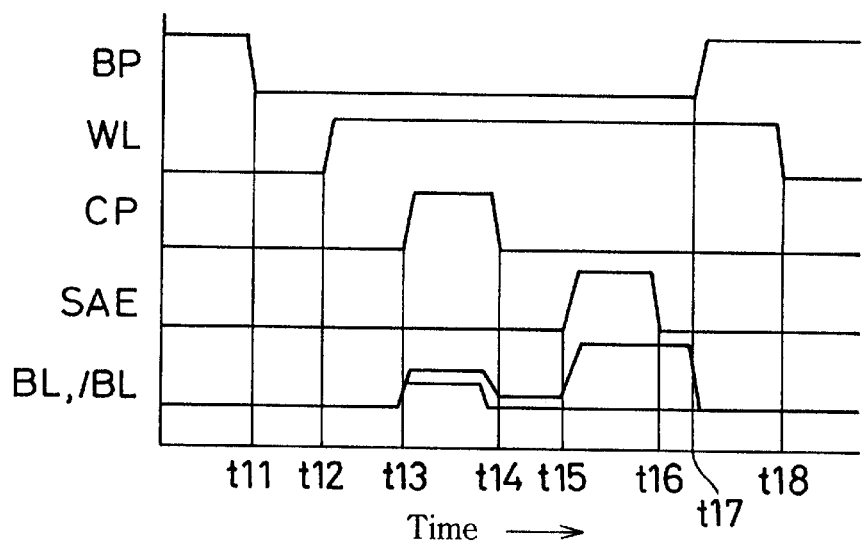
FIG. 8 is an operation timing diagram in a fourth embodiment of the invention.
Figure 9:
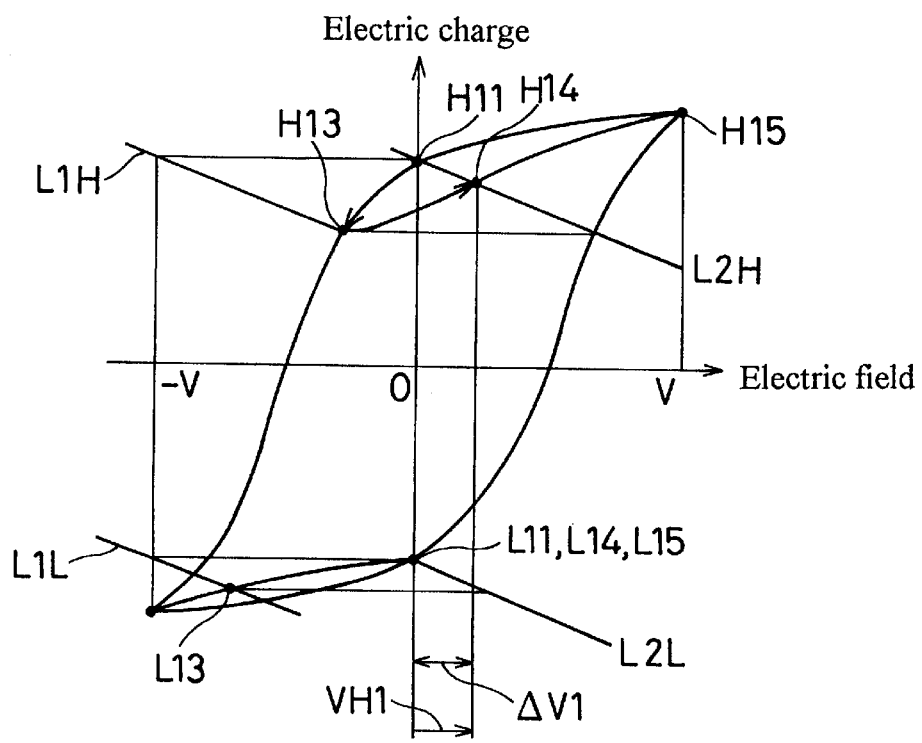
FIG. 9 is a hysteresis characteristic diagram of the ferroelectric capacitor in the fourth embodiment of the invention.
Figure 10:
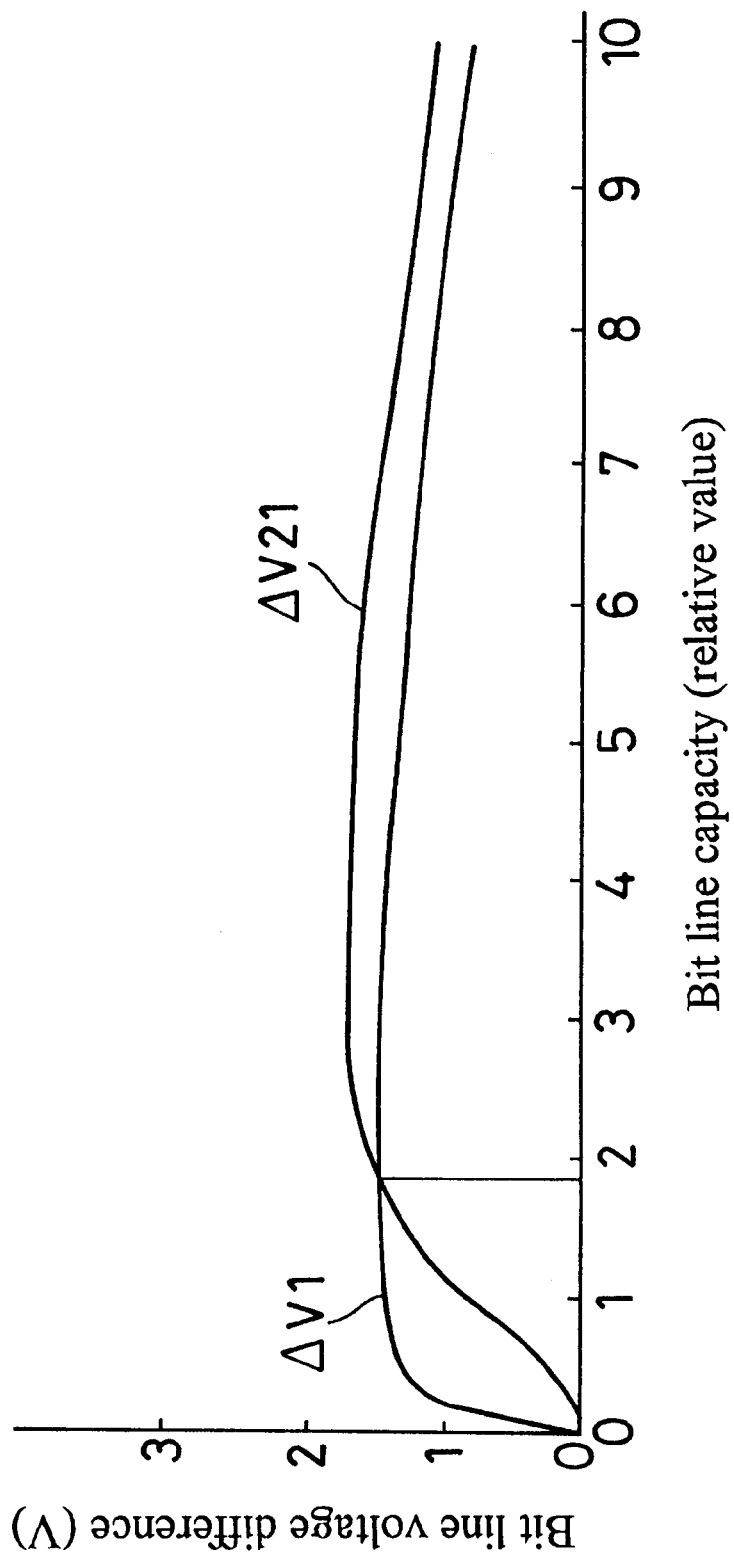
FIG. 10 is a relation diagram of supply voltage and bit line voltage when reading out data in the fourth embodiment of the invention.
Figure 11:
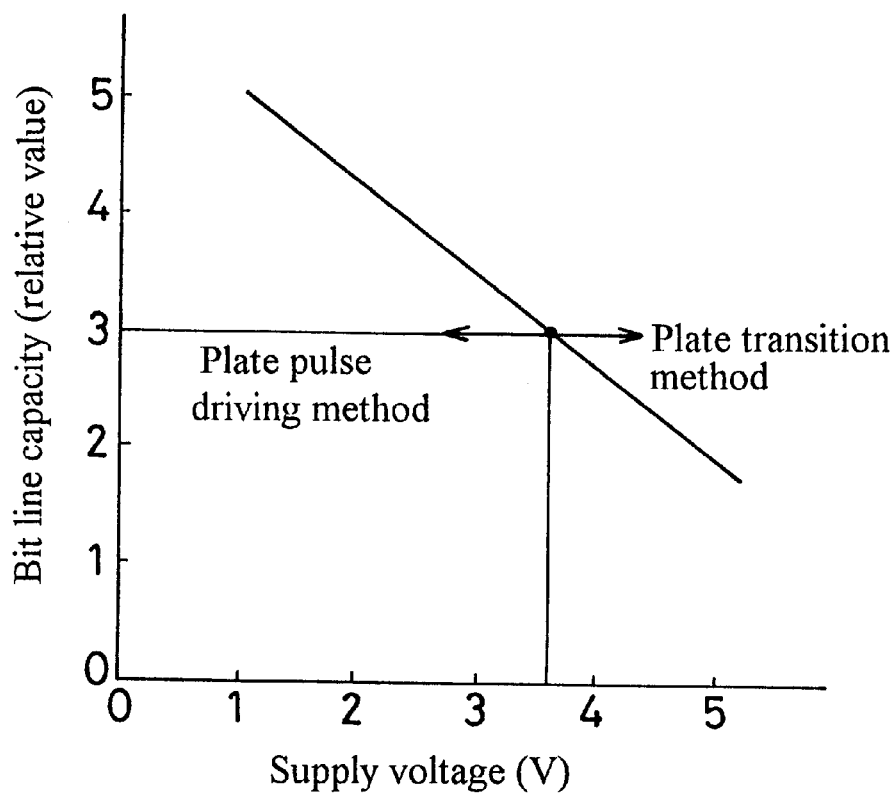
FIG. 11 is a diagram showing supply voltage dependence at selection changeover point in a plate transition operation system of the invention and plate pulse driving operation system in the fourth embodiment.

FIG. 8 is an operation timing diagram of the ferroelectric memory device of the embodiment, used selectively below a certain supply voltage, and FIG. 9 is a hysteresis characteristic diagram of operation of the ferroelectric capacitor. FIG. 10 is a relation diagram of bit line capacity and bit line voltage, and FIG. 11 is a diagram showing supply voltage dependence at selection changeover point in the conventional plate transition operation system and plate pulse driving operation system in FIG. 8. The block diagram of memory cell and its peripheral circuit is same as in FIG. 27 showing the prior art. Symbols and reference numerals are same as in the prior art. Incidentally, L2H and L2L are lines indicating the bit line capacity when the cell plate signal CP is started up to L.

The operation of the embodiment is explained below while referring to FIG. 8 and FIG. 9.

First, the bit lines BL and /BL are precharged to logic voltage L by bit line precharge signal BP.

At this time, the initial states of the ferroelectric capacitors C21 and C22 are point H11 and point L11 in FIG. 9.

At time t11, the bit lines BL and /BL are set in floating state, and at time t12, the word line WL is set to logic voltage H, and further at time t13, the cell plate signal CP is set to logic voltage H. Herein, the potential level of the logic voltage H of the word line WL is a voltage boosted over the supply voltage VDD. At this time, an electric field is applied to both electrodes of the ferroelectric capacitors C21 and C22, and the potentials determined by the capacity ratio of the bit line capacitor including the ferroelectric capacitors and parasitic capacity are produced in the bit lines BL and /BL. The states of the ferroelectric capacitors C21 and C22 are point H13 and point L13 in FIG. 9.

At time t14, the cell plate signal CP is set to logic voltage L. The states of the ferroe.lectric capacitors C21 and C22 are point H14 and point L14 in FIG. 9. The bit line voltage difference is ΔV1.

At time t15, the sense amplifier control signal SAE is set to logic voltage H, and the sense amplifier is put into operation. As a result, the potentials being read out in the bit lines are amplified to the supply voltage VDD and grounding voltage VSS, and are rewritten at the same time. The states of the ferroelectric capacitors C21 and C22 are point H15 and point L15 in FIG. 9.

Afterwards, stopping the sense amplifier, the bit lines BL and /BL are precharged to logic voltage L by the bit line precharge signal BP. The states of the ferroelectric capacitors C21 and C22 are point H11 and point L11 in FIG. 9.

In FIG. 10, the relation between the bit line capacity and bit line voltage in this plate pulse drive operating method is described. The bit line voltage difference varies depending on the bit line capacity. The bit line voltage difference is ΔV1 in the plate pulse drive operating method, and ΔV21 in the conventional plate transition operating method, and at the bit line capacity of 1.8 or less, the bit line voltage difference is greater in the plate pulse drive operating method. In FIG. 10, the supply voltage is 5 V. When the supply voltage is further lower than shown in the diagram, if the bit line capacity is large, the plate pulse drive operating method is advantageous in the aspect of the bit line potential difference as compared with the plate transition operating method. This relation is shown in FIG. 11.

In this embodiment, from the viewpoint of which operating method has a larger reading potential difference depending on the supply voltage, it is intended to select the more advantageous operating method. For example, when the bit line capacity is 3.5, the supply voltage detection is 3 V, and when the supply voltage is less than 3 V, the plate pulse drive operating method is selected, and when the supply voltage is 3 V or more, the plate transition operating method can be selected. The plate pulse drive operating method is also effective for rewriting data into the ferroelectric capacitor simultaneously with operation of sense amplifier.

(Embodiment 5)

In embodiment 5, the operating method of embodiment 4 is modified, and the potential level of the logic voltage H of the word line WL of the memory cell is the supply voltage VDD. The circuit composition and operating method are same as in embodiment 4. When the word line is not boosted but. is kept at supply voltage, there is an effect of the threshold value of the memory cell transistor of which gate is the word line, and the data of H may not be read out sufficiently in the bit line. This effect is significant when the bit line capacity is small at low voltage.

Figure 12:
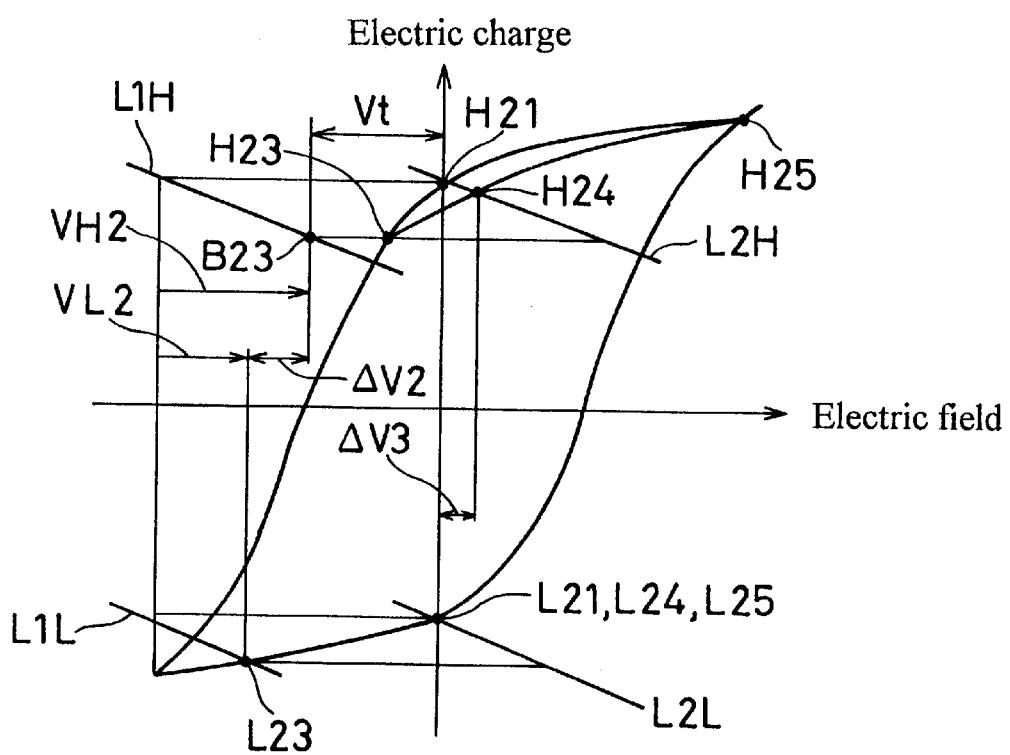
FIG. 12 is a hysteresis characteristic diagram of a ferroelectric capacitor in a fifth embodiment of the invention.

The operation is described below while referring to FIG. 8, FIG. 9, and FIG. 12. First, the bit lines BL and /BL are prechargec to logic voltage L by bit line precharge signal BP. At this time, the initial states of the ferroelectric capacitors C21 and C22 are point H21 and point L21 in FIG. 12. As shown in FIG. 8, at time t11, the bit lines BL and /BL are set in floating state, and at time t12, the word line WL is set to logic voltage H, and further at time t13, the cell plate signal CP is set to logic voltage H. Herein, the potential level of the logic voltage H of the word line WL is the supply voltage VDD. At this time, an electric field is applied to both electrodes of the ferroelectric capacitors C21 and C22, and the potentials determined by the capacity ratio of the bit line capacitor including the ferroelectric capacitors and parasitic capacity are produced. in the bit lines BL and /BL. However, due to the effect of the threshold value Vt of the memory cell transistor, since the data of H of the bit line is not read out sufficiently, the states of the ferroelectric capacitors C21 and C22 are point B23 and point L23 in FIG. 12. At this time, the bit line voltage difference is ΔV2. At time t14, the cell plate signal CP is set to logic voltage L. The states of the ferroelectric capacitors C21 and C22 are point H24 and point L24 in FIG. 12. The bit line voltage difference is ΔV3. At time t15, the sense amplifier control signal SAE is set to logic voltage H, and the sense amplifier is put into operation. As a result, the potentials being read out in the bit lines are amplified to the supply voltage VDD and grounding voltage VSS, and are rewritten at the same time. The states of the ferroelectric capacitors C21 and C22 are point H25 and point. L25 in FIG. 12. Afterwards, stopping the sense amplifier, the bit lines BL and /BL are precharged to logic voltage L by the bit line precharge signal BP. The states of the ferroe lectric capacitors C21 and C22 are point H21 and point L21 in FIG. 12.

Figure 13:
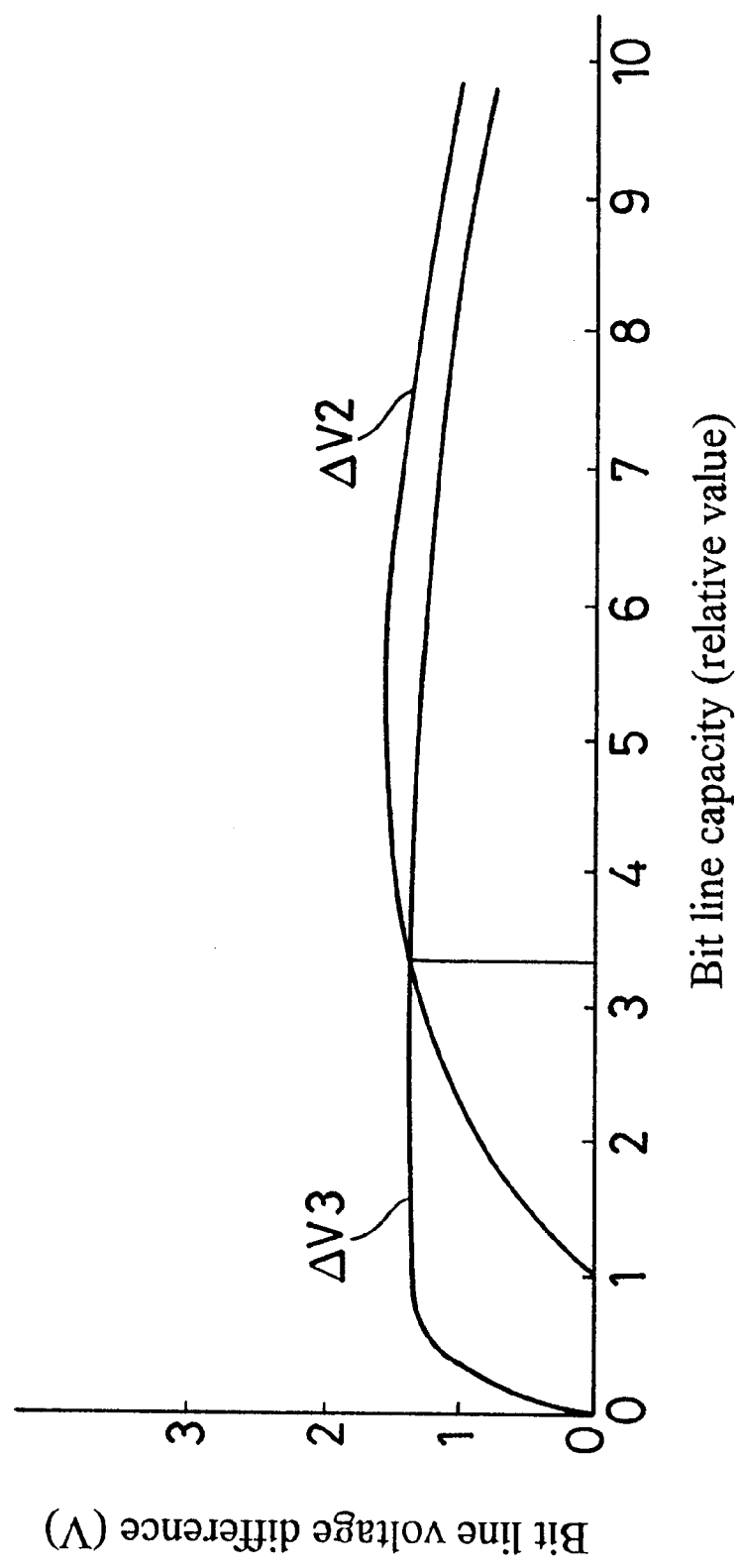
FIG. 13 is a relation diagram of supply voltage and bit line voltage when reading out data in the fifth embodiment of the invention.

In FIG. 13, the relation between the bit line capacity and bit line voltage in this plate pulse drive operating method and the conventional plate transition operating method is described. The bit line voltage difference varies depending on the bit line capacity, and it is ΔV3 in the plate pulse drive operating method, and ΔV2 in the conventional plate transition operating method. Since the word line is not boosted, in the conventional plate transition operating method, it is suddenly worsened from embodiment 4 when the bit line capacity is small. At the bit line capacity of 3.5 or less, the bit line voltage difference is greater in the plate pulse drive operating method.

In this embodiment, same as in embodiment 4, it is intended to select the more advantageous operating method for the reading potential difference depending on the supply voltage, but in this embodiment in which the word line is not boosted, its effect is greater in low voltage operation as compared with embodiment 4.

(Embodiment 6)

Embodiment 6 relates to a ferroelectric memory device of 1T1C composition, in which the operating method is selectively changed depending on the supply voltage same as in embodiment 4 or 2.

Figure 14:
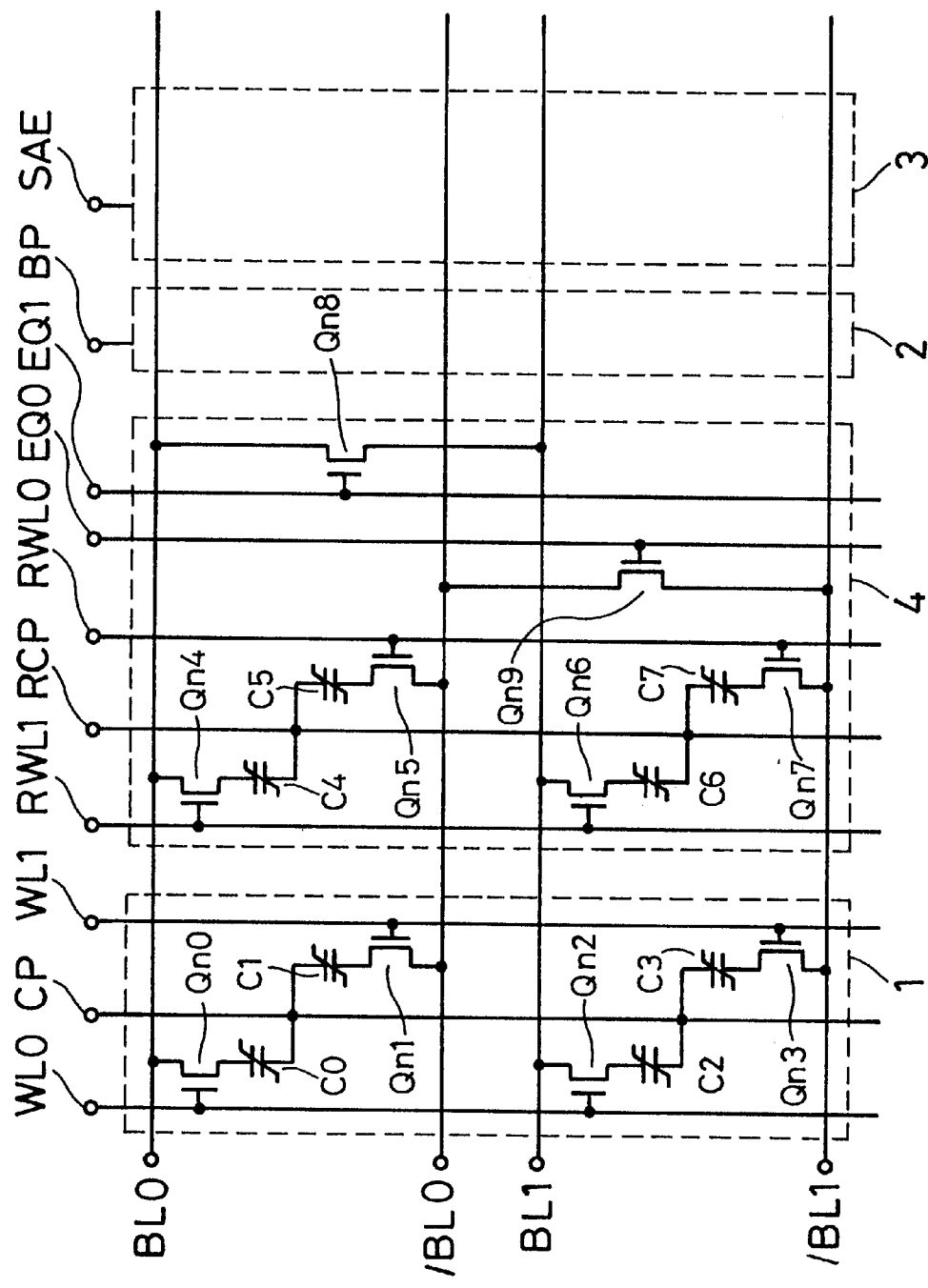
FIG. 14 is a memory cell block diagram of 1IC type.
Figure 15:
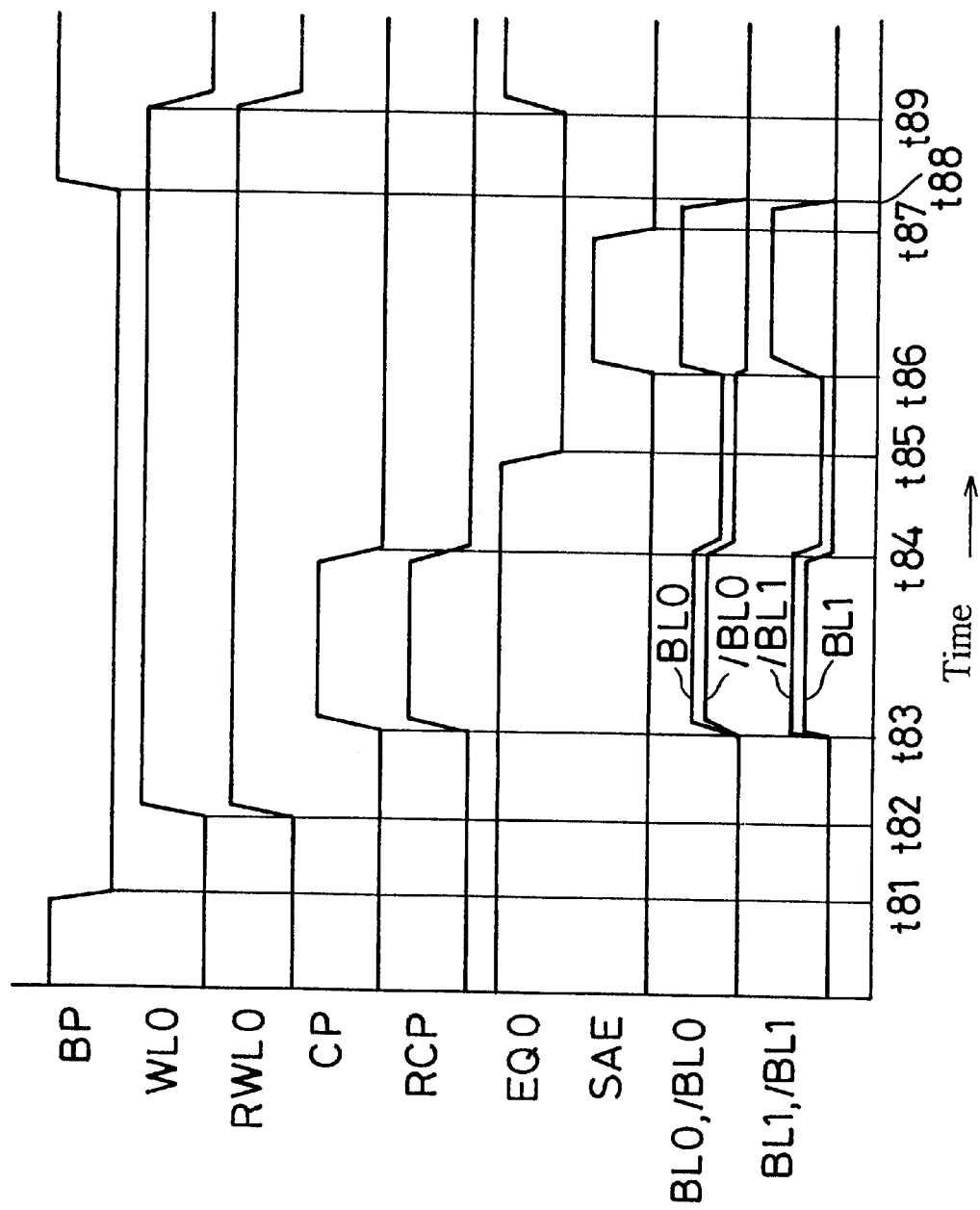
FIG. 15 is an operation timing diagram in a sixth embodiment of the invention.

FIG. 14 is a block diagram of memory cell and its peripheral circuit, and FIG. 15 is an operation timing diagram. Herein, C0 to C7 are ferroelectric capacitors, CP is a cell plate signal, RCP is a reference cell plate signal, WL0, WL1 are word lines, RWL is a reference word line, BL0–BL1, /BL0–/BL1 are bit lines, EQ0, EQ1 are bit line equalizer signals, BP is a bit line precharge signal, SAE is a sense amplifier control signal, Qn0 to Qn9 are N-channel MOS transistors, 1 is a memory cell, 2 is bit line precharge circuit, 3 is a sense amplifier, and 4 is a reference voltage generating circuit. Besides, t81 to t89 are timings. In the ferroelectric memory device of 1T1C composition, as mentioned above, there are, for example, 256 main body memory cells 1 for one reference memory, and hence there are also 256 word lines. In FIG. 14, for the sake of simplicity of explanation, only one word line is shown for one reference memory cell. To the bit line BL0, the memory cell capacitors C0, C4 are electrically connected, and to the bit line /BL0, the memory cell capacitors C1, C5 are electrically connected. Similarly, to the bit line BL1, the memory cell capacitors C2, C6 are electrically connected, and to the bit line /BL1, the memory cell capacitors C3, C7 are electrically connected.

In the circuit composition, the bit lines BL0 and /BL0 are connected to the sense amplifier 3, the ferroelectric capacitors C0, C2 are connected to the bit lines BL0, BL1 respectively through the N-channe L MOS transistors Qn0, Qn2 of which gate is the word line WL0, and these ferroelectric capacitors C0, C2 are further connected to the cell plate signal CP. To the bit lines /BL0, /BL1, the ferroelectric capacitors C5, C7 are connected respectively through N-channel MO , transistors Qn5, Qn7 of which gate is the word line RWL0, and these ferroelectric capacitors C5, C7 are further connected to the reference cell plate signal RCP. The bit lines BL0 and BL/1, and bit lines /BL0 and /BL1 can be mutually connected electrically through N-channel MOS transistors Qn8, Qn9 of which gates are bit line equalizing signal EQ0, EQ1. The sense amplifier 3 is controlled by the sense amplifier control signal SAE, and the circuit is composed so that the precharge of the bit lines BL0 and /BL0, BL1 and /BL1 can be controlled by the bit line precharge signal BP.

The operation of this embodiment is described below while referring to FIG. 15.

Herein, the plate pulse driving operation is mainly described, and the plate transition operation is same as explained in the foregoing embodiments, and its explanation is omitted.

First, the bit lines are precha.rged to logic voltage L by bit line precharge signal BP. Setting the bit lines in floating state at time t81, the word line WL0 and reference word line RWL0 are set to logic voltage H at time t82, and the cell plate signal CP and reference cell plate signal RCP are set to logic voltage H at time t83. Herein, an electric field is applied to both electrodes of the ferroelectric capacitors, and the potentials determined by the capacity ratio of the bit line capacity including the ferroelectric capacitor and parasitic capacity are read out into the bit lines. The data of H and L being read out from the reference ferroelectric capacitor memory cells are equalized by the bit lines /BL0 and /BL1, and are hence ½ of the potential of the data of H or L being read out from the main body memory cell.

At time t84, the cell plate signal CP and reference cell plate signal RCP are set to logic voltage L. At time t85, the bit line equalizing signal EQ0 is set to logic voltage L, and the bit lines /BL0 and /BL1 in which the reference potential is generated are electrically separated, and, at time t86, the sense amplifier control signal SAE is set to logic voltage H, and the sense amplifier is put into operation. As a result, the potentials being read out in the bit lines are amplified to the supply voltage VDD and grounding voltage VSS. Later, stopping the sense amplifier, the bit lines are precharged to the logic voltage L by the bit line precharge signal BP.

As the feature of operation in this embodiment, after pulse driving of the cell plate signal CP and reference cell plate signal RCP, that is, after the cell plate signal CP and reference cell plate signal RCP are set to logic voltage L, the bit line equalizing signal EQ0 is set to logic voltage L, and the bit lines in which the reference potential is generated are separated electrically. By such operation, the reference potential can be set exactly at the intermediate potential of the H data and L data being readout from the main body memory cells. If the bit lines are equalized before setting the cell plate signal to logic voltage L, it may be slightly deviated from the desired intermediate potential.

(Embodiment 7)

Embodiment 7, same as embodiment 6, relates to a ferroelectric memory device of 1T1C composition, in which the operating method is selectively changed depending on the supply voltage same as in embodiment 4 or 5.

Figure 16:
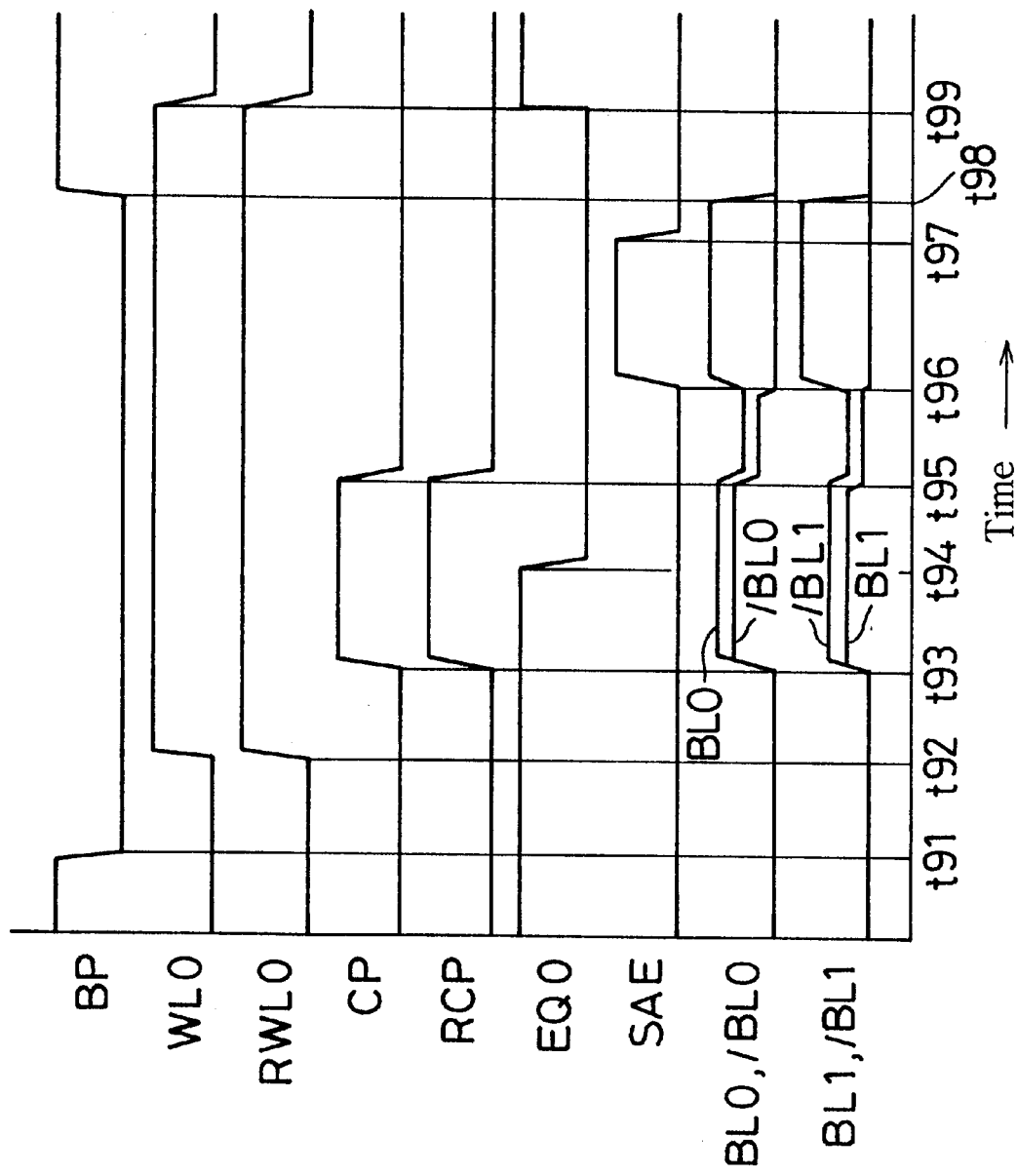
FIG. 16 is an operation timing diagram in a seventh embodiment of the invention.

FIG. 14 is a block diagram of memory cell and its peripheral circuit, and FIG. 16 is an operation timing diagram.

The operation is described below while referring to FIG. 16. First, the bit lines are precharged to logic voltage L by bit line precharge signal BP. Setting the bit lines in floating state at time t91, the word line WL0 and reference word line RWL0 are set to logic voltage H at time t92, and the cell plate signal CP and reference cell plate signal RCP are set to logic voltage H at time t93. Herein, an electric field is applied to both electrodes of the ferroelectric capacitors, and the potentials determined by the capacity ratio of the bit line capacity including the ferroelect:ric capacitor and parasitic capacity are read out into the bit lines. The data of H and L being read out from the reference ferroelectric capacitor memory cells are equalized by the bit lines /BL0 and. /BL1, and are hence ½ of the potential of the data of H or L being read out from the main body memory cell. At time t94, the bit line equalizing signal EQ0 is set to logic voltage L, and the bit lines /BL0 and /BL1 in which the reference potential is generated are electrically separated. At time t95, the cell plate signal CP and reference cell plate signal RCP are set to logic voltage L. At time t96, the sense amplifier control signal SAE is set to logic voltage H, and the sense amplifier is put into operation. As a result, the potentials being read out in the bit lines are amplified to the supply voltage VDD and grounding voltage VSS. Later, stopping the sense amplifier, the bit lines are precharged to the logic voltage L by the bit line precharge signal BP.

As the feature of operation in this embodiment, in the midst of pulse driving of the cell plate signal RCP and reference cell plate signal RCP, that is, after setting to logic voltage H, the bit line equalizing signal EQ0 is set to logic voltage L, and the bit lines in which the reference potential is generated are separated electrically, and then the cell plate signal RCP and reference cell plate signal RCP are set to logic voltage L. By such operation, the reference potential generation and sense amplifier starting can be done at high speed.

(Embodiment 8)

Figure 17:
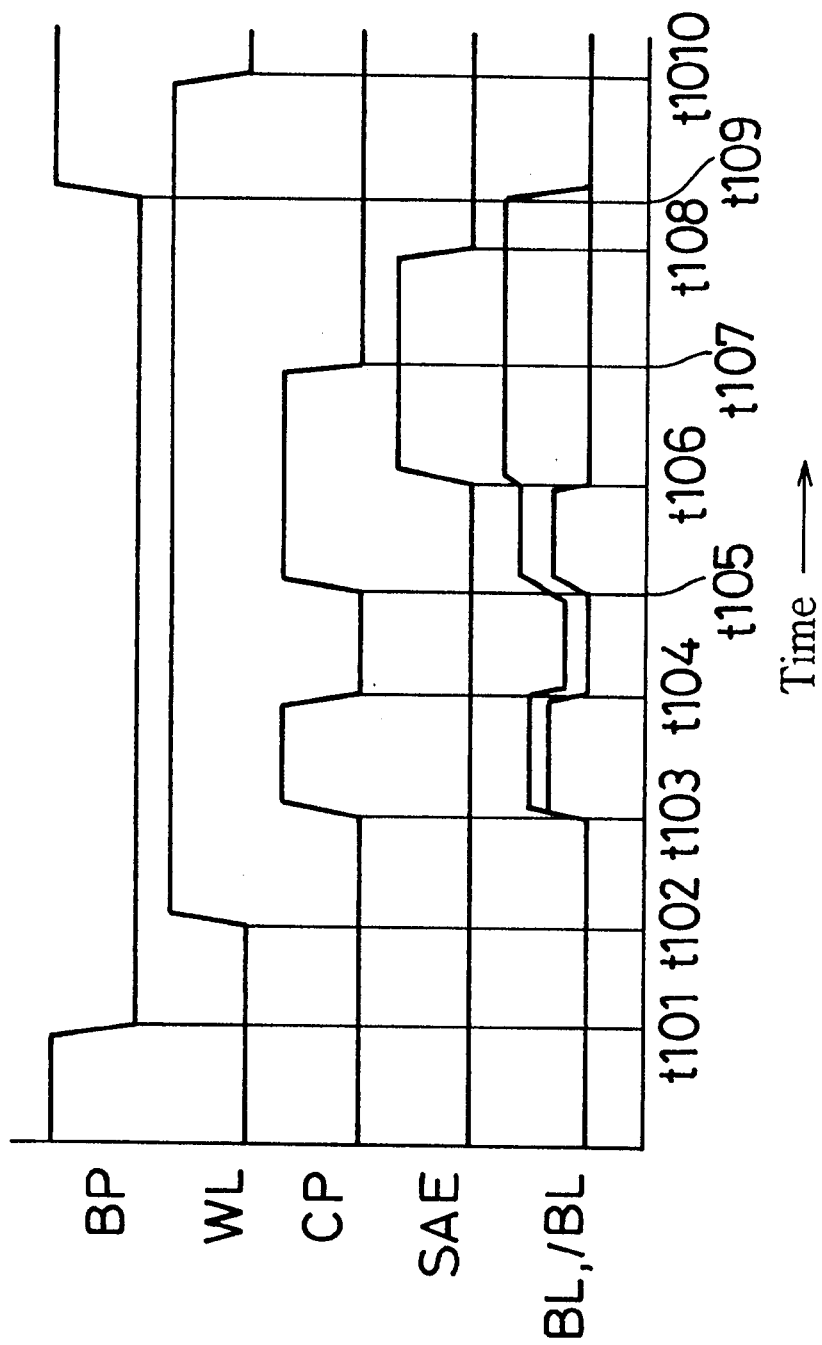
FIG. 17 is an operation timing diagram in an eighth embodiment of the invention.
Figure 18:
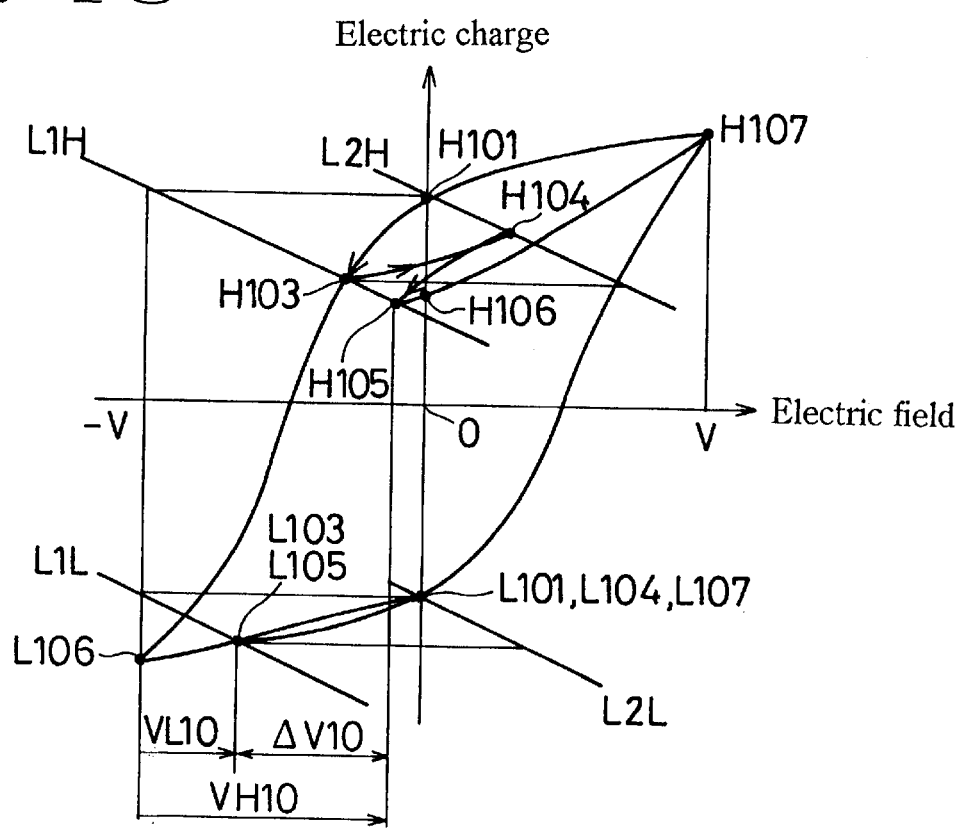
FIG. 18 is a hysteresis characteristic diagram of the ferroelectric capacitor in the eighth embodiment of the invention.

FIG. 17 is an operation timing diagram in this embodiment, and FIG. 18 is a hysteresis characteristic diagram of operation of the ferroelectric capacitor. It is a feature of the operation of this eighth embodiment that the cell plate is set to logic voltage H after driving the cell plate plural times in order to increase the reading potential difference of bit lines. Herein, the circuit composition is the circuit diagram of 2T2C shown in FIG. 27. Of course, it is also applicable to the memory composition of 1T1C type.

The operation of the embodiment is described below while referring to FIG. 17 and FIG. 18.

First, the bit lines BL and /BL are precharged to logic voltage L by bit line precharge signal BP. At this time, the initial states of the ferroelectric capacitors C21 and C22 are point H101 and point L101 in FIG. 18. At time t101, the bit lines BL and /BL are set in floating state, and at time t102, the word line WL is set to logic voltage H, and further at time t103, the cell plate signal CP is set to logic voltage H. At this time, an electric field is applied to both electrodes of the ferroelectric capacitors C21 and C22, and the potentials determined by the capacity ratio of the bit line capacitor including the ferroelectric capacitors and parasitic capacity are produced in the bit lines BL and /BL. The states of the ferroelectric capacitors C21 and C22 are point H103 and point L103 in FIG. 18. At time t104, the cell plate signal CP is set to logic voltage L. The states of the ferroelectric capacitors C21 and C22 are point H104 and point L104 in FIG. 18. At time t105, the cell plate signal CP is set to logic voltage H. The states of the ferroelectric capacitors C21 and C22 are point H105 and point L105 in FIG. 18. The bit line voltage difference is $\Delta V10$. At time t106, the sense amplifier control signal SAE is set to logic voltage H, and the sense amplifier is put into operation. As a result, the potentials being read out in the bit lines are amplified to the supply voltage VDD and grounding voltage VSS. At time t107, as rewriting operation, the cell plate signal CP is set to logic voltage L. The states of the ferroelectric capacitors C21 and C22 are point H107 and point L107 in FIG. 18. Afterwards, stopping the sense amplifier, the bit lines BL and /BL are precharged to logic voltage L by the bit line precharge signal BP. The states of the ferroelectric capacitors C21 and C22 are point H101 and point L101 in FIG. 18.

As clear from FIG. 18, the bit line voltage difference being read out at time t105 is greater than the bit line voltage difference being readout at time t103. According to this operating method, the bit line voltage difference being read out is large, stable operation is realized, and it is particularly resistant to fluctuations of characteristics of memory cell capacitors.

(Embodiment 9)

Figure 19:
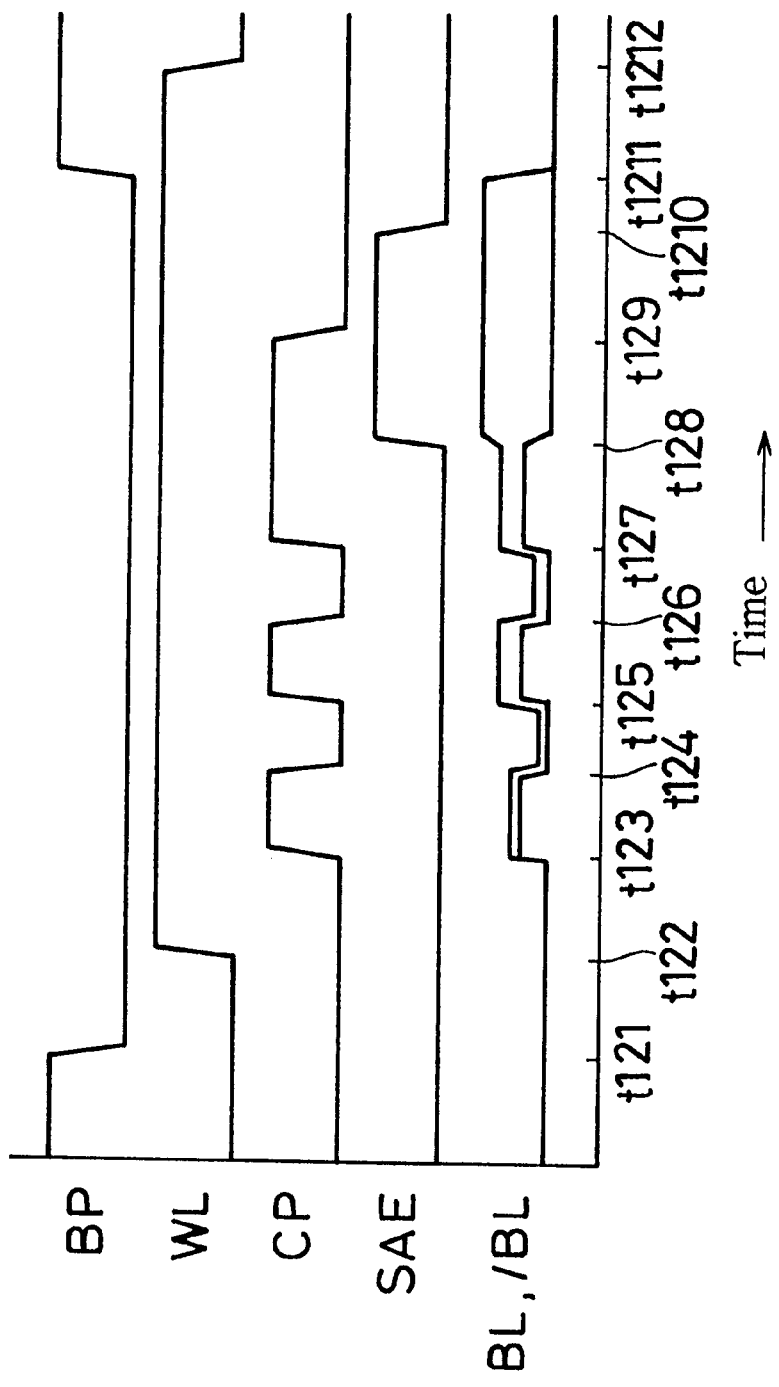
FIG. 19 is an operation timing diagram in a ninth embodiment of the invention.
Figure 20:
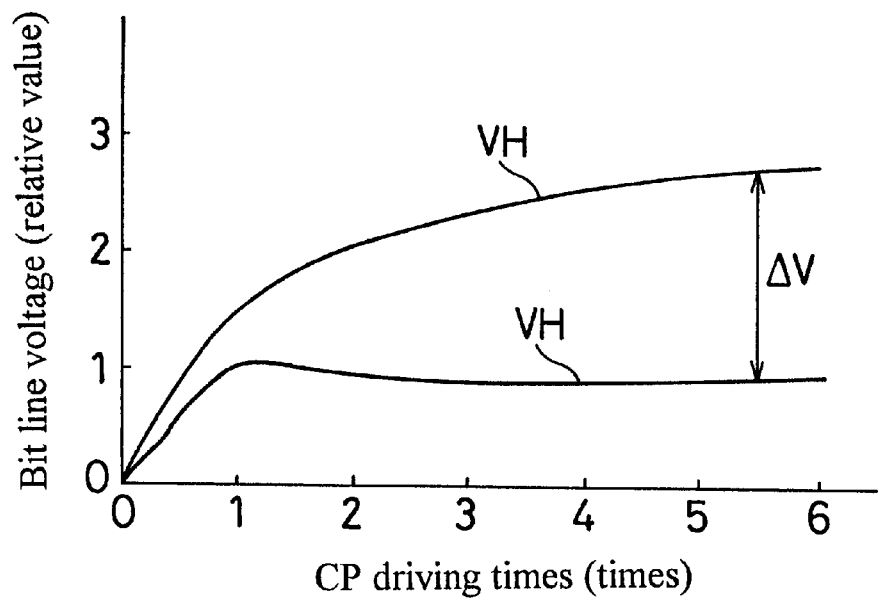
FIG. 20 is a relation diagram of number of times of plate driving and bit line reading voltage in the operation in the eighth and ninth embodiments of the invention.

FIG. 19 is an operation timing diagram in this embodiment. This embodiment is similar to the eighth embodiment, and by driving the plate plural times, the bit line voltage difference being read out is increased, but the number of times, of pulse drivinc of the plate is larger by one time than in. the eighth embodiment. Basically, the operation is same as in the eighth embodiment. FIG. 20 shows the relation between the number of times of pulse driving of the plate and the bit line voltage difference being read out. From about five times of pulse driving of the plate, the bit line voltage difference is nearly saturated. By increasing the number of times of pulse driving of the plate, the bit line voltage difference becomes larger, but the current consumption increases accordingly. Hence, an appropriate number of times of pulse driving of the plate is desired. The eighth embodiment and ninth embodiment are realistic.

(Embodiment 10)

Figure 21:
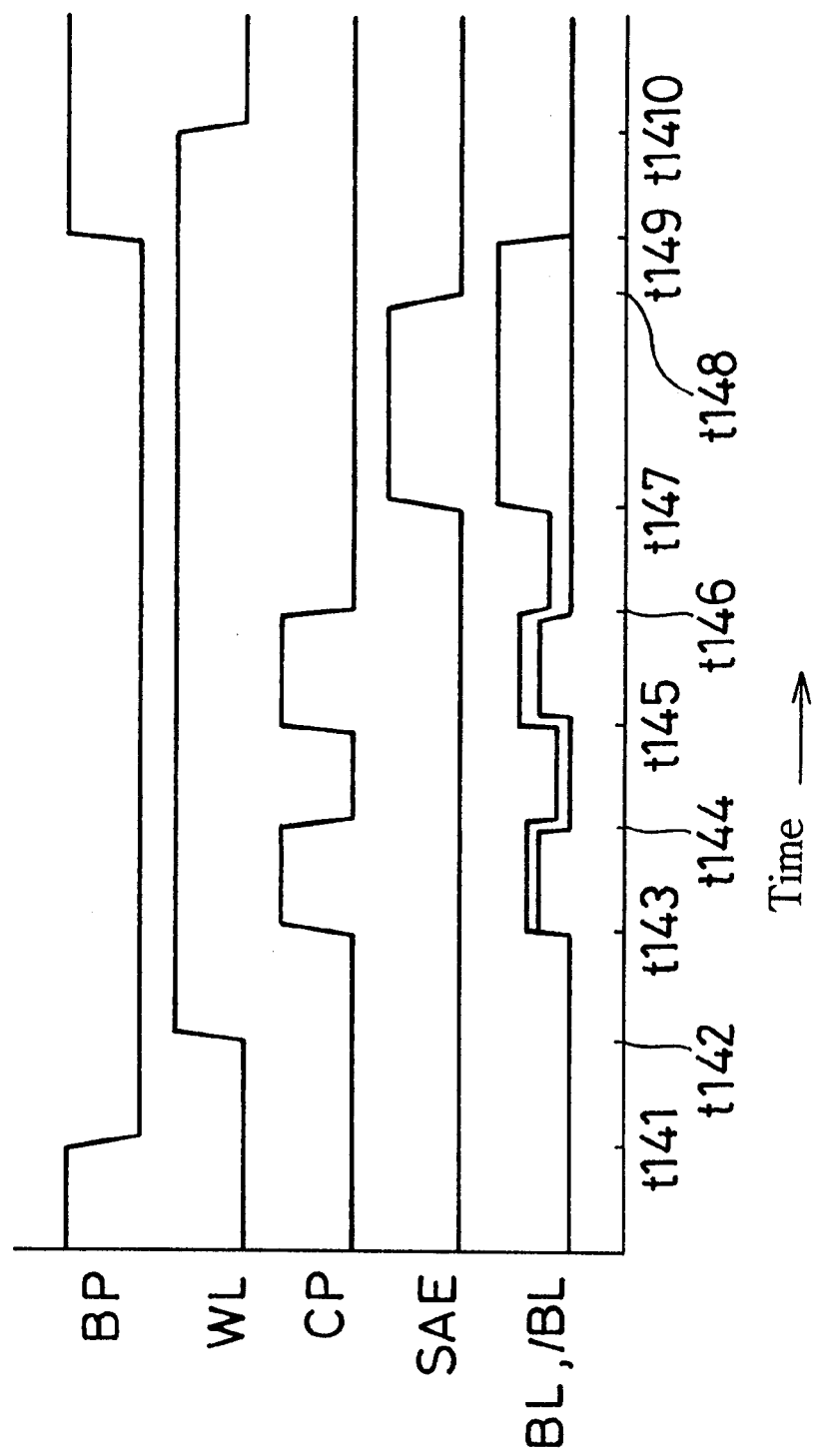
FIG. 21 is an operation timing diagram in a tenth embodiment of the invention.
Figure 22:
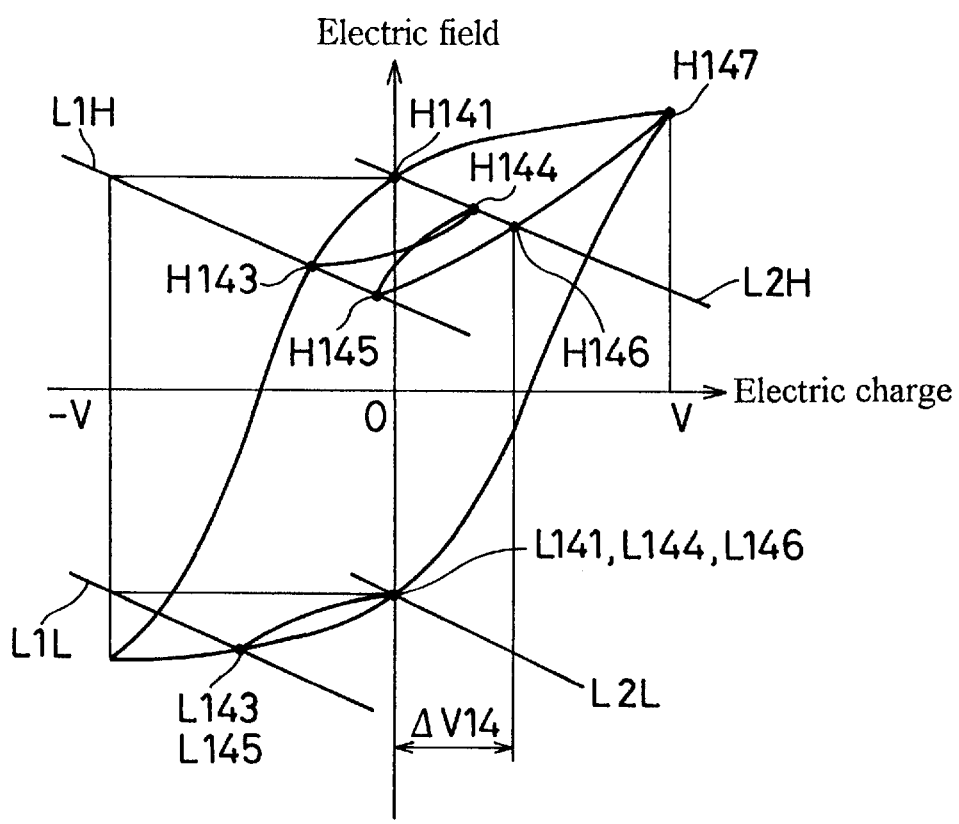
FIG. 22 is a hysteresis characteristic diagram of the ferroelectric capacitor in the tenth embodiment of the invention.

FIG. 21 is an operation timing diagram in this embodiment, and FIG. 22 is a hysteresis characteristic diagram of operation of the ferroelectric capacitor. It is a feature of operation of this embodiment that the plate is set to logic voltage L after driving the plate plural times, so that the bit line reading potential difference is larger. Herein, the circuit composition is the circuit diagram of 2T2C shown in FIG. 27. Of course, it is also applicable to the memory composition of 1T1C type.

The operation is described below while referring to FIG. 21 and FIG. 22. First, the bit lines BL and /BL are precharged to logic voltage L by bit line precharge signal BP. At this time, the initial states of the ferroelectric capacitors C21 and C22 are point H141 and point L141 in FIG. 22. At time t141, the bit lines BL and /BL are set in floating state, and at time t142, the word line WL is set to logic voltage H, and further at time t143, the cell plate signal CP is set to logic voltage H. At this time, an electric field. is applied to both electrodes of the ferroelectric capacitors C21 and C22, and the potentials determined by the capacity ratio of the bit line capacitor including the ferroelectric capacitors and parasitic capacity are produced in the bit lines BL and /BL. The states of the ferroelectric capacitors C21 and C22 are point H143 and point L143 in FIG. 22. At time t144, the cell plate signal CP is set to logic voltage L. The states of the ferroelectric capacitors C21 and C22 are point H144 and point L144 in FIG. 22. At time t145, the cell plate signal CP is set to logic voltage H. The states of the ferroelectric capacitors C21 and C22 are point H145 and point L145 in FIG. 22. At time t146, the cell plate signal CP is set to logic voltage L. The states of the ferroelectric capacitors C21 and C22 are point H146 and point L146 in FIG. 22. The bit line voltage difference is $\Delta V14$. At time t147, the sense amplifier control signal SAE is set to logic voltage H, and the sense amplifier is put into operation. As a result, the potentials being read out in the bit lines are amplified to the supply voltage VDD and grounding voltage VSS, and the data is rewritten at the same time. Afterwards, stopping the sense amplifier, the bit lines BL and /BL are precharged to logic voltage L by the bit line precharge signal BP. The states of the ferroelectric capacitors C21 and C22 are point H141 and point L141 in FIG. 22.

As clear from FIG. 22, the bit line voltage difference being read out at time t146 is greater than the bit line voltage difference bearing read out at time t144. According to this operating method, the bit line voltage difference being read out is large, stable operation is realized, and it is particularly resistant to fluctuations of characteristics of memory cell capacitors.

(Embodiment 11)

The operation timing in this embodiment is similar to that in the eighth embodiment, except that the voltage level when driving the plate plural times is varied to as to decrease the amplitude voltage.

Figure 23:
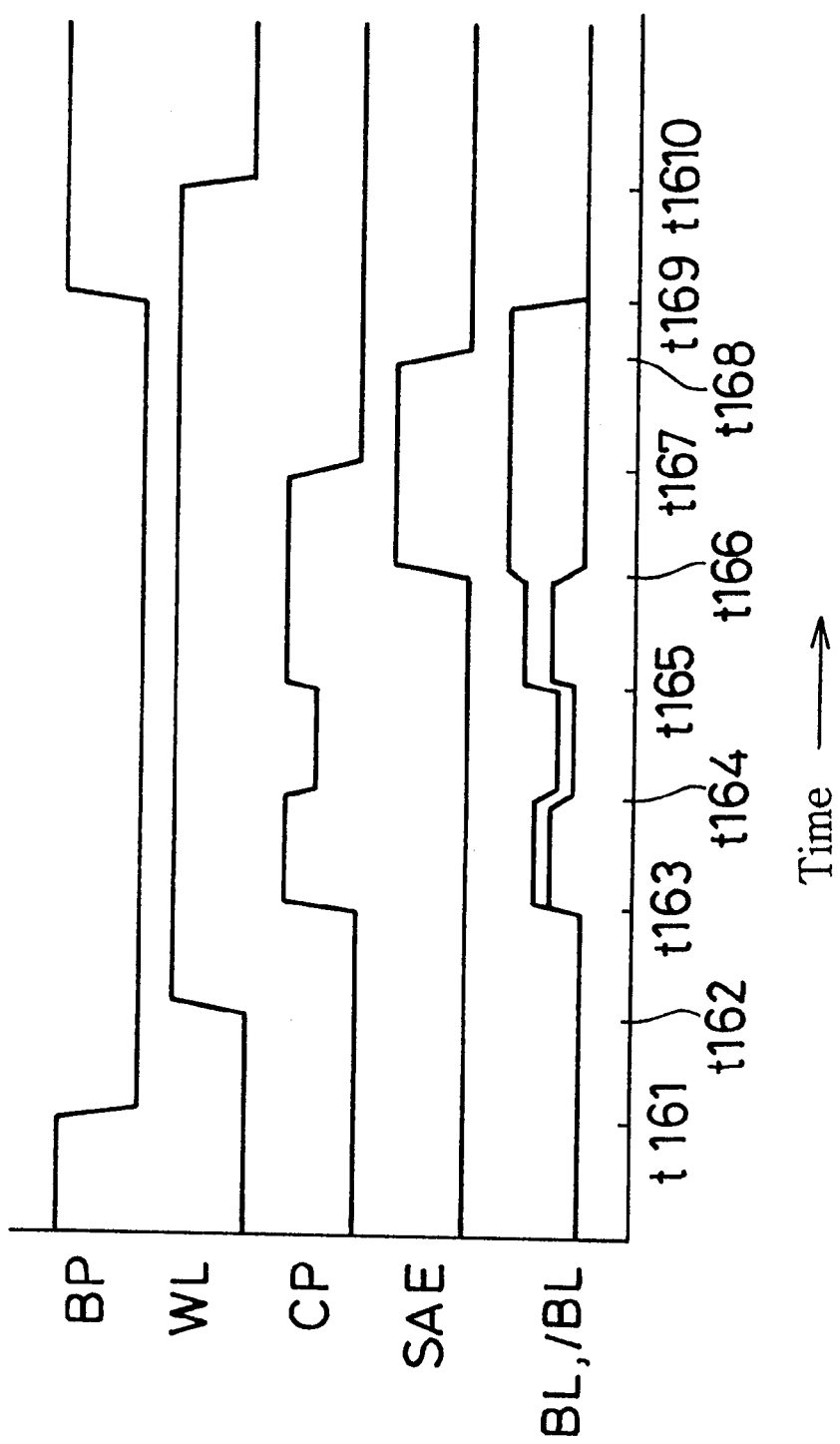
FIG. 23 is an operation timing diagram in an eleventh embodiment of the invention.
Figure 24:
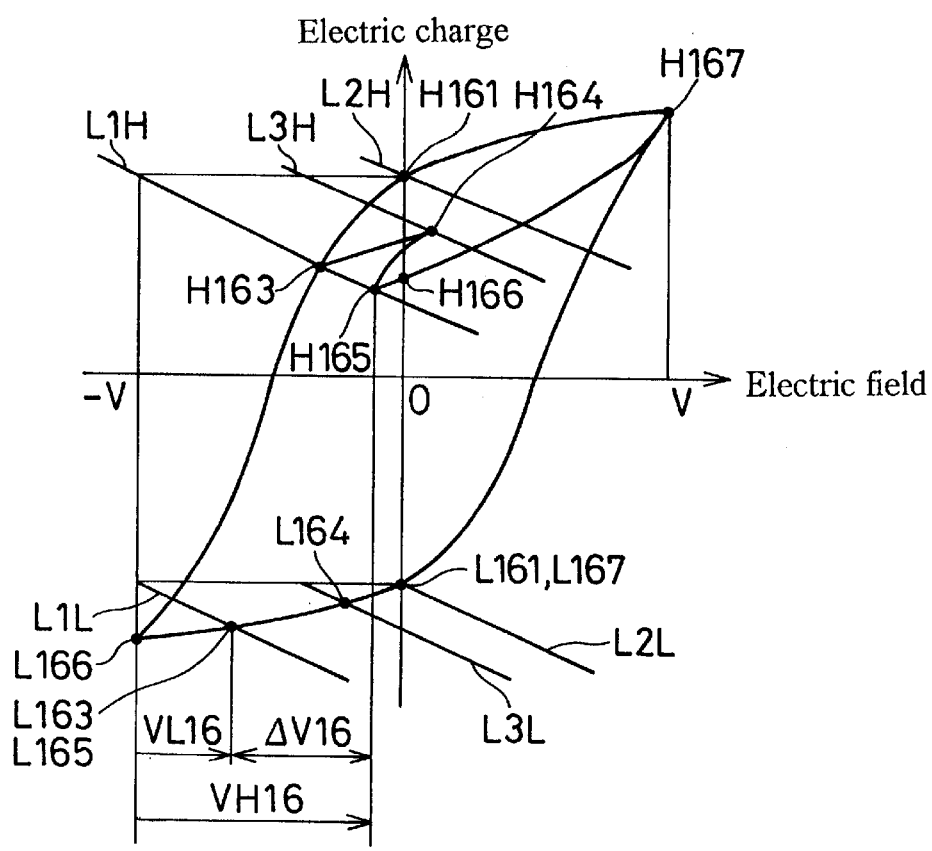
FIG. 24 is a hysteresis characteristic diagram of the ferroelectric capacitor in the eleventh embodiment of the invention.

FIG. 23 is an operation timing diagram in this embodiment, and FIG. 24 is a hysteresis characteristic diagram of operation of the ferroelectric capacitor. The operation is same asin the eighth embodiment.

In this embodiment, since the amplitude voltage of the plate is small, the power consumption is small. The reading bit line potential difference may be nearly same as in the eighth embodiment by setting the amplitude voltage.

(Embodiment 12)

The operation timing in this embodiment is similar to that in the tenth embodiment, except that the voltage level when driving the plate plural times is varied to as to decrease the amplitude voltage.

Figure 25:
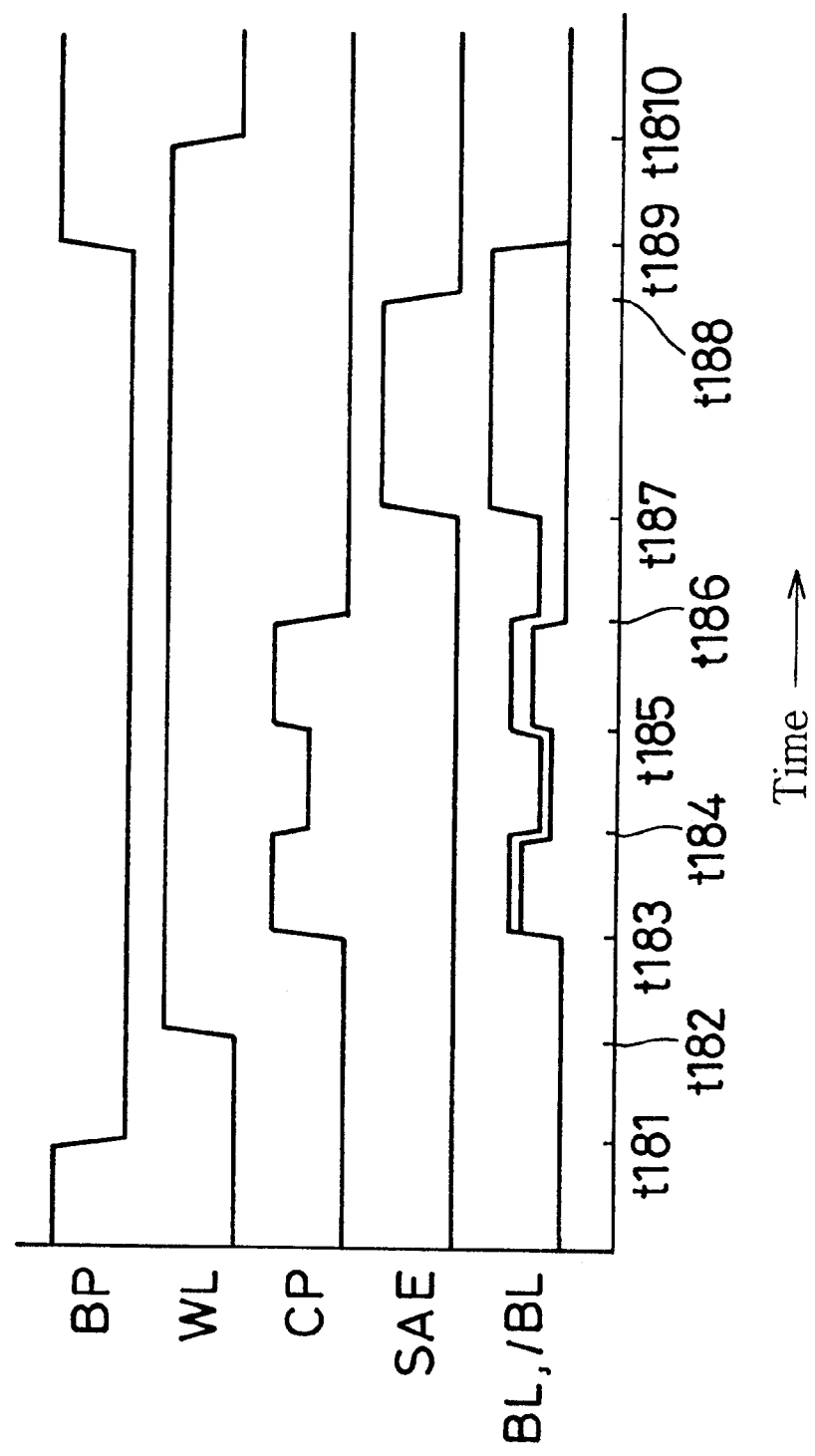
FIG. 25 is an operation timing diagram in a twelfth embodiment of the invention.
Figure 26:
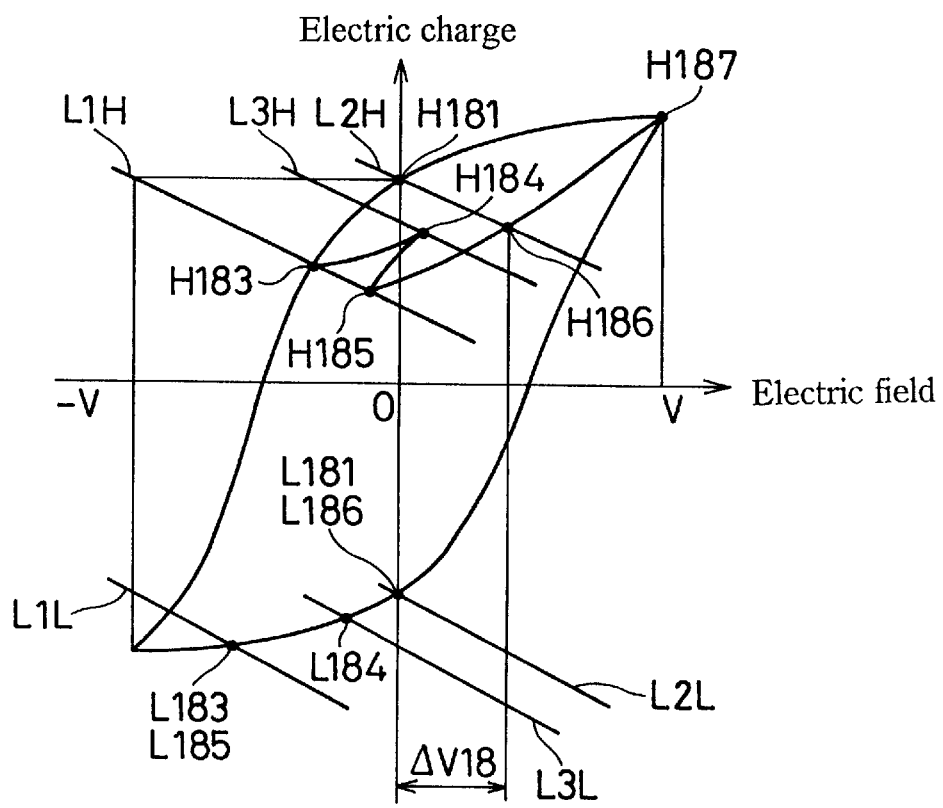
FIG. 26 is a hysteresis characteristic diagram of the ferroelectric capacitor in the twelfth embodiment of the invention.

FIG. 25 is an operation timing diagram in this embodiment, and FIG. 26 is a hysteresis characteristic diagram of operation of the ferroelectric capacitor. The operation is same as in the tenth. embodiment.

In this embodiment, since the amplitude voltage of the plate is small, the power consumption is small. The reading bit line potential difference may be nearly same as in the tenth embodiment by setting the amplitude voltage.

According to the invention as set forth in FIG. 1, for example, the potential being read out from the ferroelectric memory cell capacitor into the bit line is free from effect of threshold value of the memory cell transistor, and lower voltage operation is enabled. It is particularly effective when the capacity value of the bit line is smaller than the capacity value of the ferroelectric memory cell capacitor.

As clear from the description herein, according to the invention as set forth in FIG. 3, for example, by pulse driving of the cell plate after setting the word line in selected state, the electric charge being read out from the ferroelectric memory cell capacitor by pulse driving of the cell plate can be sufficiently read out, and waste of reading charge is avoided.

Also, according to the invention as set forth in FIG. 3, for example, by defining the word line at a voltage not higher than the supply voltage, particular boosting circuit is not needed, and moreover since the word line is not boosted, only a voltage lower by the threshold voltage of the memory cell transistor is applied to the ferroelectric memory cell capacitor. Accordingly, deterioration due to endurance of the ferroelectric memory cell capacitor is suppressed, and the endurance characteristic (rewriting characteristic) is enhanced, and the life of the number of times of rewriting is extended.

According to the invention as set forth in FIG. 3, for example, after transferring the cell plate from the first potential to the second potential, the word line is set in selected state, and then the cell plate is transferred from the second potential to the first potential, so that the operation is faster than in the invention as set forth in FIG. 1.

According to the invention as set forth, for example, by selectively changing over the plate transition operating method and the plate pulse drive operating method by a supply voltage detection signal, the reading bit line voltage difference increased in a wider supply voltage range, and low voltage operation is realized. In particular, the plate pulse drive operation method is small in the capacity value of the bit line, so that it is effective at low voltage.

According to the invention as set forth, for example, in a device not boosting the word line of the memory cell, by selectively chancing over the plate transition operating method and the plate pulse drive operating method by a supply voltage detection signal, when the capacity value of the bit line is small, as compared with the fixed conventional plate transition operating method, it is very effective for low voltage operation.

According to the invention as set forth, for example, when using the plate pulse drive operating method in the memory cell of 1T1C type, by dividing the reference bit lines of H data and L data after plate pulse driving, the ½ potential of H data and L data can be precisely generated.

According to the invention as set forth in, for example, when using the plate pulse drive operating method in the memory cell of 1T1C type, by dividing the reference bit lines of H data and L data in the midst of plate pulse driving, the reference potential generation and sense amplifier starting can be operated at high speed.

According to the invention as set forth, for example, by transferring the cell plate signal plural times, the electric charge amount being read out from the ferroelectric memory cell capacitor into the bit line is increased. In the invention, for example, by transferring the cell plate signal plural times, the sense amplifier is driven with a voltage applied to the ferroelect-ric memory cell capacitor, so that a larger reading potential difference is obtained securely as compared with the conventional plate transition operating method. In the invention, for example, by transferring the cell. plate signal plural times, the sense amplifier is driven without voltage applied to the ferroelectric memory cell capacitor, so that a larger reading potential difference is obtained in the device not boosting the word line or in low voltage operation.

According to the invention as set forth, for example, in the cell plate signal plural times transferring action, by increasing the number of times of transferring, the reading potential difference is increased, but since this reading potential difference is saturated, by optimizing the number of times of transferring, it is effective to curtail the power consumption.

According to the invention as set forth, for example, when transferring the cell plate signal plural times, the transition voltage is a smaller voltage than the supply voltage, and therefore it is effective to increase the reading potential difference and save the power consumption.

Thus, according to the invention, by transferring the cell plate signal plural times, the electric charge amount being read out from the ferroeleclric memory cell capacitor into the bit line can be increased, and in particular, therefore, the data reading method of ferroelectric memory device capable of operating at low voltage, and the ferroelectric memory method can be realized.

INDUSTRIAL APPLICABILITY

As described herein, according to the invention, for example, by making use of the potentials of the bit lines BL0 and /BL0 after applying a pulse form cell plate signal CP to the cell plate electrode, it is designed to change these potentials to logic voltage H and L by the sense amplifier, and therefore it presents a reading method of ferroelectric memory device capable of operating at low voltage more securely than in the prior art, and the ferroelectric memory device.

We claim:

1. A ferroelectric memory device having stored data comprising a memory cell transistor having a gate connected to a word line and a drain connected to a bit line, a ferroelectric capacitor storing data having a first electrode connected to a cell plate and a second electrode connected to a source of the memory cell transistor, and potential changing means connected to the bit line,
   wherein a series of operations for transferring the cell plate from a first potential to a second potential and further transferring from the second potential to the first potential is carried out at least once, and then the potential of the bit line is changed to a specified value by the potential changing means, and then the specified value is read out, and
   wherein whether the operation for changing to the specified value is done after the series of operation of the cell plate, or after transferring the cell plate from the first potential to the second potential is determined by the value of the bit line capacity and the specified supply voltage value of the ferroelectric memory device.

2. A ferroelectric memory device comprising:
   memory cell transistor having a gate connected to a word line, and a drain connected to a bit line,
   a cell plate for transferring to a specified potential,
   a ferroelectric capacitor storing data, having a first electrode connected to the cell plate and a second electrode connected to the source of the memory cell transistor,
   a sense amplifier connected to the bit line, and
   control means for making the cell plate potential transfer from a first potential to a second potential, and further transfer from the second potential to a direction toward the first potential, and then making the sense amplifier operate so that the potential of the bit line may be changed to a specified value.

3. A ferroelectric memory device of claim 2, wherein the transferring to the direction toward the first potential is transferring to the first potential, and a potential difference of the first potential and second potential of the cell plate is larger than the driving voltage of the sense amplifier.

4. A ferroelectric memory device of claim 2, wherein the transferring to the direction toward the first potential is transferring to the first potential, the first potential and the second potential correspond respectively to a low level and a high level voltage and the control means transfers the cell plate from the first potential to the second potential and then back from the second potential to the first potential after selecting the word line.

5. A ferroelectric memory device of claim 2, wherein the word line has a voltage lower than the driving voltage of the sense amplifier.

6. A ferroelectric memory device of claim 2, wherein the control means transfers the cell plate from the first potential to the second potential, and then selects the word line, and further transfers the cell plate from the second potential to the first potential.

7. A ferroelectric memory device comprising:
   a memory cell transistor having a gate connected to a word line, and a drain connected to a bit line,
   a ferroelectric capacitor having a first electrode connected to a cell plate, and a second electrode connected to the source of the memory cell transistor,
   a sense amplifier connected to the bit line,
   a voltage detecting circuit for detecting a specified voltage, and
   a control circuit for controlling driving of the cell plate on the basis of the detected voltage,
   wherein the control circuit changes over to either driving mode of a first driving mode for transferring and driving the cell plate, or a second driving mode of driving the cell plate by pulses, depending on whether the result of detection by the voltage detecting circuit satisfies a specified standard or not.

8. A ferroelectric memory device of claim 7, wherein the voltage in the selected state of the word line is a voltage lower than the supply voltage.

9. A ferroelectric memory device comprising:
   a first memory cell transistor having a gate connected to a first word line, and a drain connected to a first bit line,
   a first ferroelectric capacitor having a first electrode connected to a cell plate, and a second electrode connected to the source of the first memory cell transistor, a second memory cell transistor having a gate connected to a second word line, and a drain connected to a second bit line, a second ferroelectric capacitor having a third electrode connected to a cell plate and a fourth electrode connected to the source of the second memory cell transistor, a switching transistor for electrically connecting the first bit line and the second bit line, and a sense amplifier connected to one of the first bit line and the second bit line, wherein the first word line and the second word line are selected, in the ON state of the switching transistor, the cell plate is transferred from a first supply voltage to a second supply voltage, and is further transferred to the first supply voltage, and then the switching transistor is turned off.

10. A ferroelectric memory device comprising:

a first memory cell transistor having a gate connected to a first word line, and a drain connected to a first bit line, a first ferroelectric capacitor having a first electrode connected to a cell plate, and a second electrode connected to the source of the first memory cell transistor, a second memory cell transistor having a gate connected to a second word line, and a drain connected to a second bit line, a second ferroelectric capacitor having a third electrode connected to a cell plate and a fourth electrode connected to the source of the second memory cell transistor, a switching transistor for electrically connecting the first bit line and the second bit line, and a sense amplifier connected to one of the first bit line and the second bit line, wherein the first word line and the second word line are selected, in the ON state of the switching transistor, the cell plate is transferred from a first supply voltage to a second supply voltage, and after the switching transistor is turned off, the cell plate is further transferred to the first supply voltage.

11. A ferroelectric memory device comprising:

a memory cell transistor having a gate connected to a word line, and a drain connected to a bit line, a ferroelectric capacitor having a first electrode connected to a cell plate, and a second electrode connected to the source of the memory cell transistor, a sense amplifier connected to the bit line, and a control circuit for controlling the cell plate and the sense amplifier, wherein the sense amplifier is operated after transferring the cell plate to a first supply voltage and a second supply voltage plural times.

12. A ferroelectric memory device comprising:

a memory cell transistor having a gate connected to a word line, and a drain connected to a bit line, a ferroelectric capacitor having a first electrode connected to a cell plate, and a second electrode connected to the source of the memory cell transistor, a sense amplifier connected to the bit line, and a control circuit for controlling the cell plate and the sense amplifier, wherein the sense amplifier is operated after transferring the cell plate to a first supply voltage and a second supply voltage plural times and, wherein the difference between the first supply voltage and the second supply voltage is greater than the driving voltage of the sense amplifier.

13. A ferroelectric memory device comprising:

a memory cell transistor having a gate connected to a word line, and a drain connected to a bit line, a ferroelectric capacitor having a first electrode connected to a cell plate, and a second electrode connected to the source of the memory cell transistor, a sense amplifier connected to the bit line, and a control circuit for controlling the cell plate and the sense amplifier, wherein an initial voltage of the cell plate is a first supply voltage, the cell plate is transferred to the first supply voltage and a second supply voltage plural times, and is transferred to the second supply voltage, then the sense amplifier is operated.

14. A ferroelectric memory device comprising:

a memory cell transistor having a gate connected to a word line, and a drain connected to a bit line, a ferroelectric capacitor having a first electrode connected to a cell plate, and a second electrode connected to the source of the memory cell transistor, a sense amplifier connected to the bit line, and a control circuit for controlling the cell plate and the sense amplifier, wherein an initial voltage of the cell plate is a first supply voltage, the cell plate is transferred to the first supply voltage and a second supply voltage plural times, and is transferred to the first supply voltage, then the sense amplifier is operated.

15. A ferroelectric memory device comprising:

a memory cell transistor having a gate connected to a word line, and a drain connected to a bit line, a ferroelectric capacitor having a first electrode connected to a cell plate, and a second electrode connected to the source of the memory cell transistor, a sense amplifier connected to the bit line, and a control circuit for controlling the cell plate and the sense amplifier, wherein when operating the sense amplifier after transferring the cell plate to a first supply voltage and a second supply voltage plural times, the cell plate is transferred until becoming substantially more than half of the maximum of the reading electric charge amount to the bit line.

16. A ferroelectric memory device comprising:

a memory cell transistor having a gate connected to a word line, and a drain connected to a bit line, a ferroelectric capacitor having a first electrode connected to a cell plate, and a second electrode connected to the source of the memory cell transistor, a sense amplifier connected to the bit line, and a control circuit. for controlling the cell plate and the sense amplifier, wherein an initial voltage of the cell plate is a first supply voltage, the cell plate is transferred to a second supply voltage and a third supply voltage plural times, and then the sense amplifier is operated.

17. A ferroelectric memory device comprising:

a memory cell transistor having a gate connected to a word line, and a drain connected to a bit line, a ferroelectric capacitor having a first electrode connected to a cell plate, and a second electrode connected to the source of the memory cell transistor, a sense amplifier connected to the bit line, and a control circuit for controlling the cell plate and the sense amplifier, wherein an initial voltage of the cell plate is a first supply voltage, the cell plate is transferred to a second supply voltage and a third supply voltage plural times, and is transferred to the third supply voltage, then the sense amplifier is operated.

18. A ferroelectric memory device comprising:

a memory cell transistor having a gate connected to a word line, and a drain connected to a bit line, a ferroelectric capacitor having a first electrode connected to a cell plate, and a second electrode connected to the source of the memory cell transistor, a sense amplifier connected to the bit line, and a control circuit for controlling the cell plate and the sense amplifier, wherein an initial voltage of the cell plate is a first supply voltage, the cell plate is transferred to a second supply voltage and a third supply voltage plural times, and is transferred to the first supply voltage, then the sense amplifier is operated.

19. A data reading method of a ferroelectric memory device having i) a memory cell transistor having a gate connected to a word line and a drain connected to a bit line, ii) a ferroelectric capacitor storing data having a first electrode connected to a cell plate and a second electrode connected to the source of the memory cell transistor, and iii) potential changing means connected to the bit line, the method comprising the steps of:

a) sequencing at least once the cell plate potential from a first potential to a second potential and then back from the second potential toward a direction to the first potential, b) changing a potential of the bit line to a specified potential value after completion of step (a), and (c) reading out the specified potential value.

20. A data reading method of ferroelectric memory device of claim 19, wherein whether the operation for changing to the specified potential value is done after the series of operation of the cell plate, or after transferring the cell plate from the first potential to the second potential is determined by the value of the bit line capacity and the specified supply voltage value of the ferroelectric memory device.

21. The method of claim 19 wherein step (a) includes sequencing the cell plate potentials a plurality of times.

22. The method of claim 19 wherein the potential difference between the first potential and the second potential is larger than a driving voltage of the potential changing means.

* * * * *

UNITED STATES PATENT AND TRADEMARK OFFICE
CERTIFICATE OF CORRECTION

PATENT NO. : 6,028,782  
DATED : February 22, 2000  
INVENTOR(S) : Hirano et al.

Page 1 of 1

It is certified that error appears in the above-identified patent and that said Letters Patent is hereby corrected as shown below:

Title page, Item [56], References cited, U.S. Patent Documents add:

| | | |
|---|---|---|
| 5,694,353 | 12/1997 | Koike |
| 5,768,182 | 06/1998 | Hu et al. |
| 5,754,466 | 05/1998 | Arase |
| 5,297,077 | 03/1994 | Imai et al. |

Column 20,  
Line 8, before "memory" insert -- a -- .

Signed and Sealed this

Fourth Day of September, 2001

*Attest:*

NICHOLAS P. GODICI  
*Attesting Officer*     *Acting Director of the United States Patent and Trademark Office*